(12) United States Patent
Pierrat

(10) Patent No.: US 8,479,125 B2
(45) Date of Patent: Jul. 2, 2013

(54) LITHOGRAPHY MODELING AND APPLICATIONS

(76) Inventor: Christophe Pierrat, Santa Clara, CA (US)

( * ) Notice: Subject to any disclaimer, the term of this patent is extended or adjusted under 35 U.S.C. 154(b) by 235 days.

(21) Appl. No.: 12/730,370

(22) Filed: Mar. 24, 2010

(65) Prior Publication Data

US 2010/0251202 A1    Sep. 30, 2010

Related U.S. Application Data

(60) Provisional application No. 61/165,031, filed on Mar. 31, 2009.

(51) Int. Cl.
*G06F 17/50* (2006.01)
(52) U.S. Cl.
USPC .................. 716/50; 716/51; 716/52; 716/53; 716/54; 716/55
(58) Field of Classification Search
USPC .............................. 716/50, 51, 52, 53, 54, 55
See application file for complete search history.

(56) References Cited

U.S. PATENT DOCUMENTS

| | | | |
|---|---|---|---|
| 6,541,167 B2 * | 4/2003 | Petersen et al. | 430/5 |
| 7,026,082 B2 * | 4/2006 | Eurlings et al. | 430/30 |
| 7,117,478 B2 | 10/2006 | Ye et al. | |
| 7,921,383 B1 * | 4/2011 | Wei | 716/54 |
| 2008/0170773 A1 | 7/2008 | Wihl et al. | |
| 2009/0012769 A1 | 1/2009 | Wang et al. | |
| 2009/0070083 A1 | 3/2009 | Zhang et al. | |

OTHER PUBLICATIONS

Adam Konstantinos et al., Improved Modeling Performance with an Adapted Vectorial Formulation of the Hopkins Imaging Equation, Optical Microlithography XVI, Anthony Yen, Editor, Proceedings of SPIE, vol. 5040 (2003), pp. 78-91.
Donis G. Flagello et al., Optimizing and Enhancing Optical Systems to Meet the Low k1 Challenge, Optical Microlithography XVI, Anthony Yen, Editor, Proceedings of SPIE vol. 5040 (2003), pp. 139-150.
Young-Seog Kang et al., Process latitude extension in low k1 DRAM lithography using specific layer oriented illumination design, Optical Microlithography XVI, Anthony Yen, Editor, Proceedings of SPIE vol. 5040 (2003), pp. 1304-1309.

(Continued)

*Primary Examiner* — Jack Chiang
*Assistant Examiner* — Brian Ngo

(57) ABSTRACT

The manufacturing of integrated circuits relies on the use of lithography simulation to predict the image of the mask created on the wafer. Such predictions can be used for example to assess the quality of the images, verify the manufacturability of such images, perform using OPC necessary correction of the mask data to achieve images close to the targets, optimize the printing parameters such as the illumination source, or globally optimize the source and the mask to achieve better printability. This disclosure provides a technique based on the association of at least one kernel function per source region or source point. Each kernel function can be directly convoluted with a mask image to create a prediction of the wafer image. As the kernel functions are associated with the source, the source can be easily changed to create new models. The optical system can be fully described by computing the possible kernels for all possible source points and all possible numerical apertures. Therefore this technique is ideally suited for source-mask optimization as well as source-mask-numerical aperture optimization, and their associated applications.

30 Claims, 18 Drawing Sheets

OTHER PUBLICATIONS

Donis G. Flagello et al., Optical Lithography in the sub-50nm regime, Optical Microlithography XVII, edited by Bruce W. Smith, Proceedings of SPIE vol. 5377 (SPIE, Bellingham, WA, 2004), pp. 21-33.

Robert Socha et al., Contact Hole Reticle Optimization by Using Interference Mapping Lithography (IMLTM), Optical Microlithography XVII, edited by Bruce W. Smith, Proceedings of SPIE vol. 5377 (SPIE, Bellingham, WA, 2004), pp. 222-240.

Adam Konstantinos et al., Polarization Effects in Immersion Lithography, Optical Microlithography XVII, edited by Bruce W. Smith, Proceedings of SPIE vol. 5377, (SPIE, Bellingham, WA, 2004), pp. 329-343.

Daniel S. Abrams et al., Fast Inverse Lithography Technology, Optical Microlithography XIX, edited by Donis G. Flagello, Proc. of SPIE vol. 6154, 61541J1-9, (2006).

Miyoko Kawashima et al., Mask optimization for arbitrary patterns with 2D-TCC resolution enhancement technique, Optical Microlithography XXI, edited by Harry J. Levinson, Mircea V. Dusa, Proc. of SPIE vol. 6924, 69240F1-12, (2008).

Richard Schenker et al., Integration of Pixelated Phase Masks for Full-Chip Random Logic Layers, Optical Microlithography XXI, edited by Harry J. Levinson, Mircea V. Dusa, Proc. of SPIE vol. 6924, 6924011-11, (2008).

Philip D. Flanner III, Two-Dimensional Optical Imaging for Photolithography Simulation, Memorandum No. UCB/ERL M86/57, Jul. 3, 1986, Electronics Research Laboratory, College of Engineering, University of California, Berkeley 94720.

J. Fung Chen et al., Development of a Computational Lithography Roadmap, Optical Microlithography XXI, edited by Harry J. Levinson, Mircea V. Dusa, Proc. of SPIE vol. 6924, 69241C1-12, (2008).

Adam Konstantinos et al., Hybrid Hopkins-Abbe Method for Modeling Oblique Angle Mask Effects in OPC, Optical Microlithography XXI, edited by Harry J. Levinson, Mircea V. Dusa, Proc. of SPIE vol. 6924, 69241E1-12, (2008).

Nicolas Bailey Cobb, Fast Optical and Process Proximity Correction Algorithms for Integrated Circuit Manufacturing, PhD Thesis, Engineering: Electrical Engineering and Computer Science in the Graduate Division of the University of California at Berkeley, Spring, 1998.

Donis G. Flagello, Theory of high-NA imaging in homogeneous thin films, vol. 13, No. 1/Jan. 1996/J. Opt. Soc. Am. A, pp. 58-64.

Brian Heffner, Single-Mode Propagation of Mutual Temporal Coherence: Equivalence of Time and Frequency Measurements of Polarization Mode Dispersion, Instruments and Photonics Laboratory, HP Labs Technical Journal, HPL-94-22, Mar. 1994, pp. 1-7.

Jerry Y. Z. Guo et al., Modeling X-Ray Proximity Lithography, IBM J. Res. Develop. vol. 37 No. 3 May 1993, pp. 331-349.

Sentaurus Lithography, Predictive Computational Lithography for Accelerated Process Development, Synopsis Datasheet, Jan. 2009, pp. 1-4.

Peng Yu et al., Fast Lithography Simulation under Focus Variations for OPC and Layout Optimizations, Electrical and Computer Engineering Department, University of Texas at Austin, 2006.

T. Schmoeller, at al., "EUV pattern shift compensation strategies", Emerging Lithographic Technologies XII, edited by Frank M. Schellenberg, Proc. of SPIE vol. 6921, 69211B, (2008), 8 pages.

Medea, T406: Extreme UV Consortium for Imaging Technology, http://www.catrene.org/web/downloads/results_medea/Project_Result_T406.pdf, Mar. 2009.

Hua-Yu Liu et al., OPC model separability speeds computational lithography, Solid State Technology, vol. 51, Issue 4, Apr. 2008.

Thuc H. Dam et al., Validation and Application of a Mask Model for Inverse Lithography, Proceedings vol. 6925, Design for Manufacturability through Design-Process Integration II, Vivek K. Singh; Michael L. Rieger, Editors, 69251J1-8, Mar. 19, 2008.

\* cited by examiner

LITHOGRAPHY MODELING AND APPLICATIONS

FIELD OF THE INVENTION

The invention relates to semiconductor manufacturing. More specifically, the invention relates to a method for simulating lithographic masks and related processes.

BACKGROUND

The manufacturing of integrated circuits in high volumes relies on lithography to define the features printed on the semiconductor chips. The lithography process starts first by coating the surface of the semiconductor wafer with a radiation-sensitive material called a photo-resist or resist. An image of a mask is projected onto the resist and the resist is subsequently developed to create a resist pattern on a wafer. A source of radiation is shone through the mask in the case of a transparent mask. Transparent masks are mostly used in optical lithography with typical wavelengths of 436 nm, 405 nm, 365 nm, 248 nm, 193 nm and possible future wavelengths of 157 nm, and 126 nm. Transparent masks made of opaque regions and clear regions are referred to as binary masks. Alternatively transparent masks can be made of a partially transparent layer patterned to define clear and partially transparent regions to the radiation. The optical properties of the partially transparent material, namely its complex refractive index and its thickness, are chosen to adjust the phase and transmission of the light going through the partially transparent material as compared to the phase and the transmission of the light going through the clear regions of the mask.

As the feature size decreases in comparison to the exposure wavelength, distortion in the pattern transfer process becomes more severe and the quality of the image is drastically altered, essentially due to the properties of light, and the fact that the wavelength of light becomes significant relative to feature size and mask thickness for very small patterns.

Many different approaches have been used in order to correct for these effects including the use of proximity effect correction, phase shifting masks, inverse lithography, off-axis illumination, customized illumination and source-mask optimization. These techniques typically rely on the use of accurate lithography modeling in order to assess the improvement of the image or generate a corrected mask layout or a corrected source distribution.

One approach to lithography modeling is based on the fact that the source can be considered a spatially incoherent collection of independent sources. Each source point gives an image according to coherent imaging. The total image is the incoherent addition of the individual images for each source point. Each source point has a corresponding propagation direction of the light impinging on the mask. This method is usually referred as the "source integration method." The intensity on the wafer is the sum of the intensity computed for each source point. For a given source point the Fourier transform of the mask is computed and only the mask diffraction orders going through the lens pupil are taken into account to compute the image. Accurate results can be obtained but the overall computation is slow due to the need to compute the mask diffraction spectrum and due to the reconstruction of the image for each source point.

Another approach is based on the calculation of the transmission cross coefficients (TCC), which describes a four dimensional low pass filter applied to the spatial frequencies of the mask and of its complex conjugate. An advantage of the TCC calculation is that the TCC can be computed once for a given exposure tool and reused for different mask layouts as long as the mask layout size is the same. A Singular Value Decomposition (SVD) is applied to a TCC matrix, and the resulting "Kernels" can be convolved directly to the mask pattern to generate a wafer image. As eigenvalues of the SVD decay rapidly, only the first few Kernels are used to compute the images with sufficient accuracy. As the convolution is a linear operation, the mask can be decomposed into simpler shapes and the convolutions to simpler shapes can be precomputed and stored in look-up tables. The calculation of the image is then performed by using the look-up table results.

The TCC technique offers the advantage that it is efficient in terms of speed, but often at the expense of accuracy; the TCC technique relies on a number of approximations and it is not well suited for applications where the parameters of the optical system need to be changed like for example custom illumination and source-mask illumination, (the TCC typically must be recomputed for each new illuminator). On the other hand, the source integration method is quite accurate and flexible but it is too slow to be used for very large computations like for example proximity effect correction of a large chip or inverse lithography.

What is needed is a simulation method that combines speed, accuracy and flexibility, and an associated way to make semiconductor masks that are more accurate and that cost less to develop. Such a method could potentially substantially reduce the cost of semiconductor design, and ultimately, semiconductor manufacture. The present invention satisfies these needs and provides further, related advantages.

DETAILED DESCRIPTION

Figure 1:
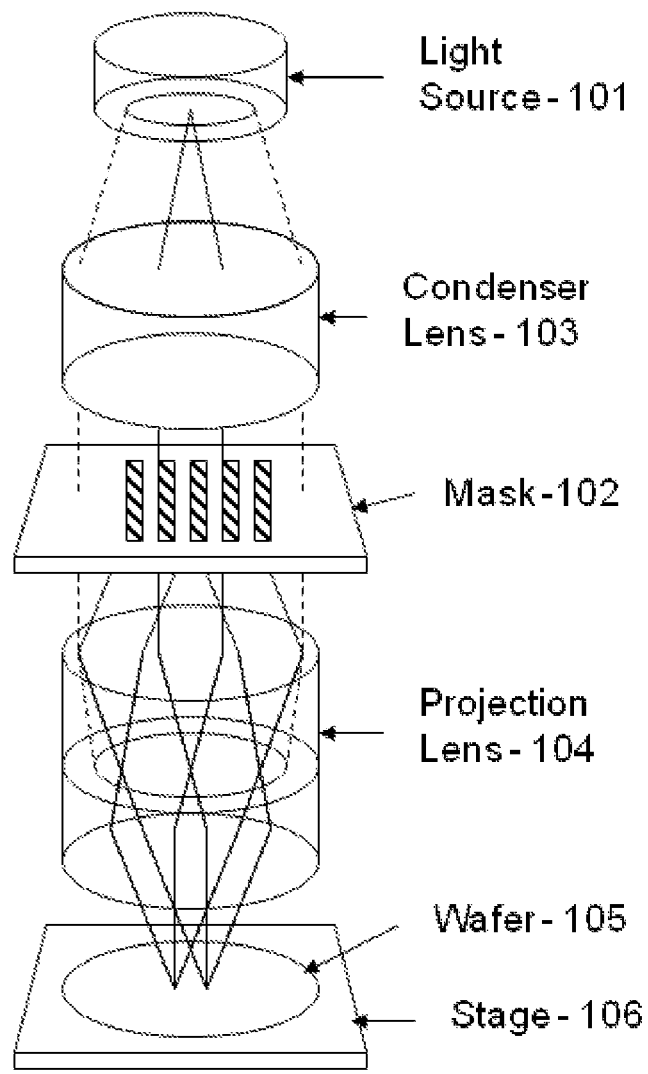
FIG. 1 illustrates the optical lithography tool used in the creation of a mask image on the wafer.

This disclosure provides a novel method of simulating an image associated with a semiconductor mask. Instead of relying upon a complex mask function which must be changed each and every time source radiation is changed or moved relative to the mask, source displacement is aggregated with a projection function (such as a pupil function), associated with the optics system. Thus, the specifics of the projection system can be formatted in a mask-independent manner, and a mask layout file can be created which is source independent. If desired, other functions can also later combined with these functions, such as development functions, or other projection functions (such as flare, dispersion, or source dependent mask effects). By effectively modeling source displacement in a manner that does not require recomputation of mask transmission parameters with each and every source change, the teachings providing by this disclosure provide the ability to greatly accelerate simulation, and thereby reduce cost associated with mask design and the semiconductor fabrication process.

One form of implementing these teachings is as a process or method applied for example to mask optimization, such that errors in simulated images of a mask can be corrected for before the mask is even fabricated (i.e., transferred to physical form). This method can also be applied to source optimization (including source-mask optimization), to projection (i.e., lens) optimization, or to potentially other functions; that is to say, with a more accurate image representation created using the teachings of this disclosure, in fast, effective manner, the image representation can be correlated with mask design and used to optimize the source, lens, mask, or other design factors (i.e., that better minimize deviation between the image representation and the mask design).

A second form of implementing these teachings is a device including instructions stored on machine-readable media, e.g., software. The media may for example include a hard drive, computer RAM, a floppy disk, jump drive, DVD, CDROM, or other optical or electrical physical storage in which a computer program might be stored, whether as software, firmware, or in another manner. The software, when run on a computer, implements the process or method introduced just above, and may be used by integrated circuit (IC) designers and manufacturers to develop ICs or associated masks using far less time and expense.

The method introduced above operates by obtaining a set of one or more source points that collectively represent the radiation source, where each source point corresponds to a source region; for example, the radiation source may be modeled as a grid, and as one or more source points (each point in one square, polygon or other shape in the grid). Not every shape need have a source point, i.e., the radiation source can be moved, divided into multiple points, consolidated, etc., as part of the design process, to determine which source model (and associated real-world projection device design) gives results appropriate to the desired design. A mask function is then obtained from a computer-readable medium; the mask function typically represents that part of the mask that is source-independent (such as transmissivity), modeled as a Kirchhoff thin mask design, although more complicated, source dependent functions may also be used. A projection function is then obtained (e.g., retrieved from a memory or pre-generated file, or generated run time), where the projection function is dependent upon at least one source point (that is, one shape in the grid). Typically, this projection function is a shifted effective pupil function that is source point dependent, meaning that the function changes as the source is moved; however, it is also possible to use other projection functions (i.e., any function associated with the transmission of radiation from the source to a semiconductor resist, to form an image, which is independent of the mask design). The method (e.g., the software) then combines the mask function with the projection function to obtain a "combined result" (that is, a combination of the functions that predicts part of the image attributable to the source point). This computation can be performed for each source point modeled in the grid, with the associated "combined results" being combined to generate the modeled image. For example, if the source is divided into a grid of 100 squares, ten-by-ten, and the source is modeled as exactly two points in this grid, the combinations might be performed twice (one for each point) and aggregated to predict an image where two of the 100 squares were used as a radiation source.

With the general embodiments presented by this disclosure thus introduced, additional detail regarding specific software implementation will be presented below. While primarily couched in mathematical terms, it should be understood that equations and principles set forth below will be implemented typically in the form of software code, that is, a set of instructions that causes a computer to roughly implement the operations described below, storing and retrieving as necessary individual operands so as to simulate an image. As mentioned earlier, these principles may be applied to a wide variety of applications, e.g., anything that might use a simulated image, including source optimization, inverse lithography and other techniques. Also, the techniques introduced above may be optionally combined with other modeling factors, for example, exposure and development modeling associated with an image and materials and equipment used to provide a resist, and expose and develop (etch) the resist.

Additional details on the use of this computation and its application is explained with respect to FIG. 1, which shows a projection system used to transfer a pattern from a mask onto a resist. Following this introduction, and a discussion of images and optimization in general, details will be presented on specific algorithms which can be used.

During the exposure to a radiation source, an image of the mask is projected inside the resist layer using an optical system (or imaging system) such as the one described in FIG. 1. A light source 101 illuminates the mask 102 through the condenser lens 103. The image of the mask is projected by the projection lens 104 on the wafer 105, the wafer being supported by the wafer stage 106.

Figure 2:
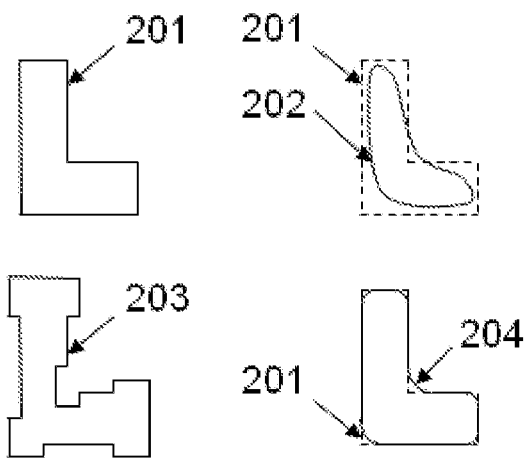
FIG. 2 illustrates the proximity effects and the OPC effectiveness.

FIG. 2 illustrates the modification of the mask data to correct for proximity effects in OPC software tools. The processing of the mask data starts with a target layout 201 representing the desired dimensions of the image on the wafer. The printed image 202 of the target layout 201 differs from the desired image due to proximity effect. For reference, the target image 201 is shown in phantom lines, superimposed above the printed image 202, with discrepancies being represented by the differences between the two images. The edges of the features are then moved (e.g., per design outline 203) to correct for the discrepancies, so that the corresponding printed image on the wafer 204 is correct (i.e., as close to the target as possible). In FIG. 2, all the areas of the layout have been corrected but different degrees of proximity effect correction aggressiveness can be applied to different regions depending on the criticality of the region in the integrated circuit.

The corrections to layout 201 can be applied using a rule-based approach or a model-based approach. For a rule-based approach (Rule-based OPC), the displacement of the segments would be set by a list of rules depending, for example, on the feature size and its environment. For a model-based approach (Model-based OPC), the printed image on the wafer would be simulated using a model of the pattern transfer process. The correction would be set such that the simulated image matches the desired wafer image. A combination of rule-based OPC and model-based OPC sometimes referred to as hybrid OPC can also be used.

Figure 3:
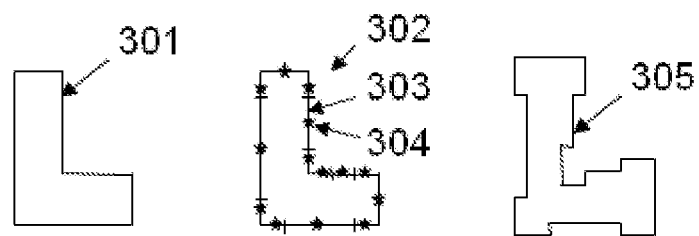
FIG. 3 illustrates the process flow used for model-based OPC.

In the case of model-based OPC, the original layout 301 as shown in FIG. 3 is dissected in smaller segments 303 shown in modified layout 302. Each segment is associated an evaluation point 304. The printed errors of the evaluation points are compensated by moving the corresponding segment in a direction perpendicular to the segment as shown in the final layout 305. The segments are corrected using multiple iterations in order to account for corrections of neighboring segments.

Figure 4:
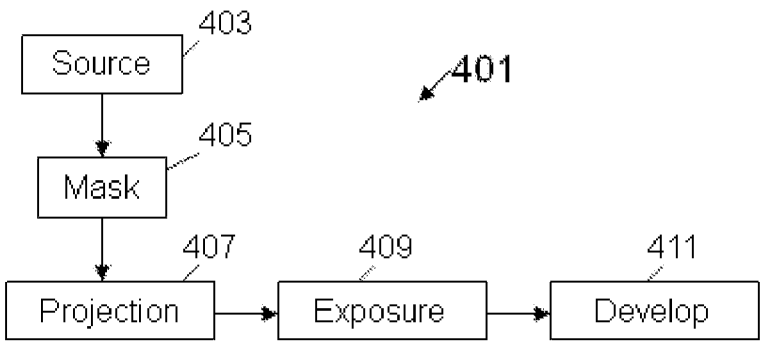
FIG. 4 illustrates the process flow used in lithography.

The simulation of lithography processes typically includes one of more of the processes described in FIG. 4. The processes include the source (403), the mask (405), the projection (407), the exposure (409) and the develop (411). The more complete the simulation model, the more accurate the results obtained. For example, the projection of the mask image can be basic or can account for additional effects such as flare and polarization effects; the effects of defocus throughout the resist thickness can also be modeled.

Figure 5:
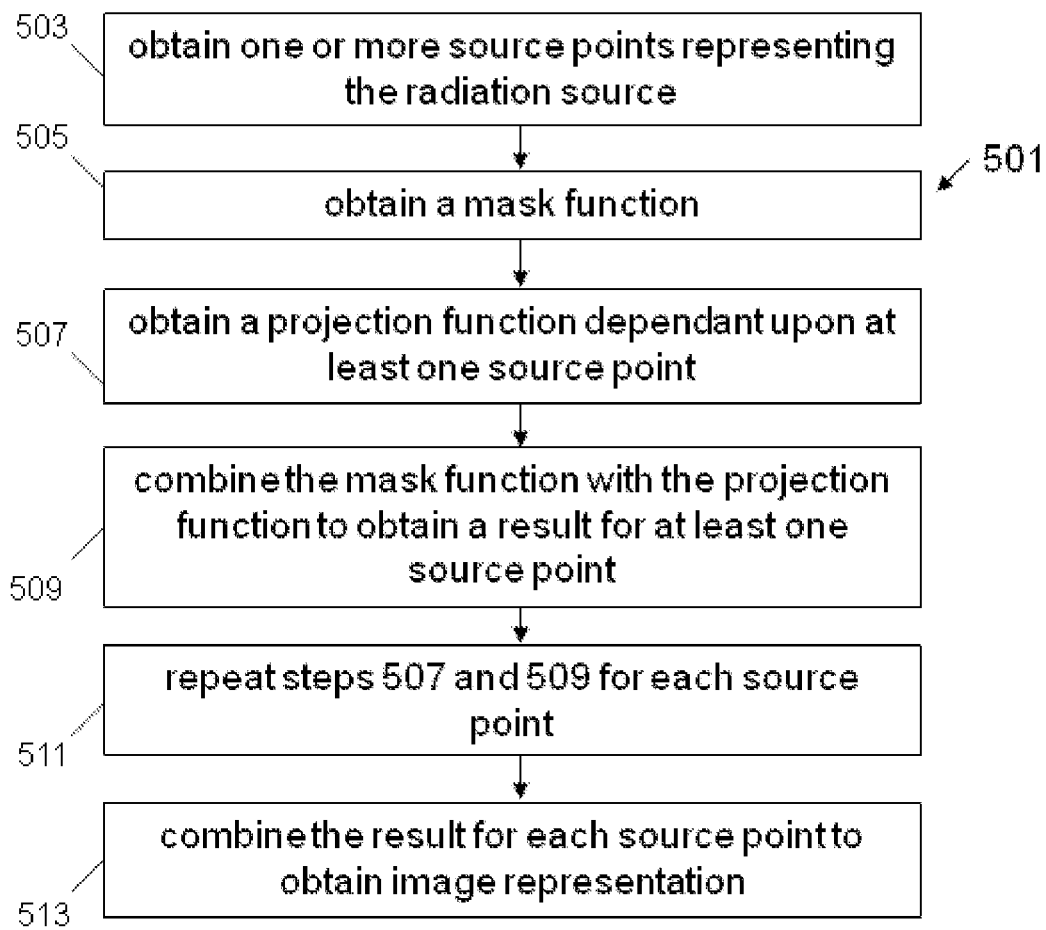
FIG. 5 illustrates the creation on an image representation of a mask.

FIG. 5 describes a method (501) of building such an image. The radiation source can be represented by its source points (503) associated to regions of the source. Each source point is associated to at least one projection function (507). A mask function (505) is also created and combined with the projection function (507) to create a result for a given source point. This step is repeated (511) for all the source points and the results are combined (513) to create and image representation of the mask.

Figure 6:
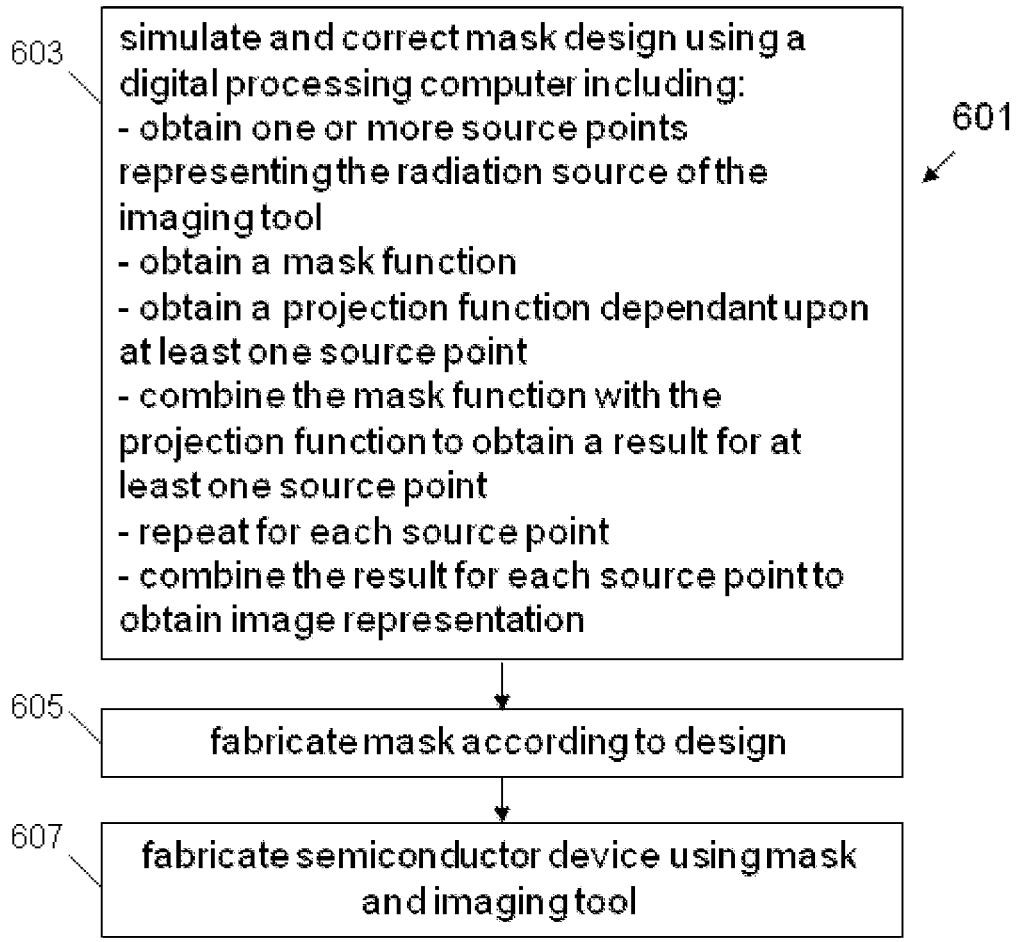
FIG. 6 is a flow chart describing the fabrication of an integrated circuit.

The image representation of the mask can be ultimately used in the fabrication of semiconductor devices (601) as described in FIG. 6. The mask design can be simulated and corrected (603) using the method described in FIG. 5. The resulting mask design is used to create a physical mask (605) which can be then placed an imaging tool to fabricate (607) the semiconductor device. A given mask would expose one level of multiple levels needed to create a complete semiconductor device.

Figure 7:
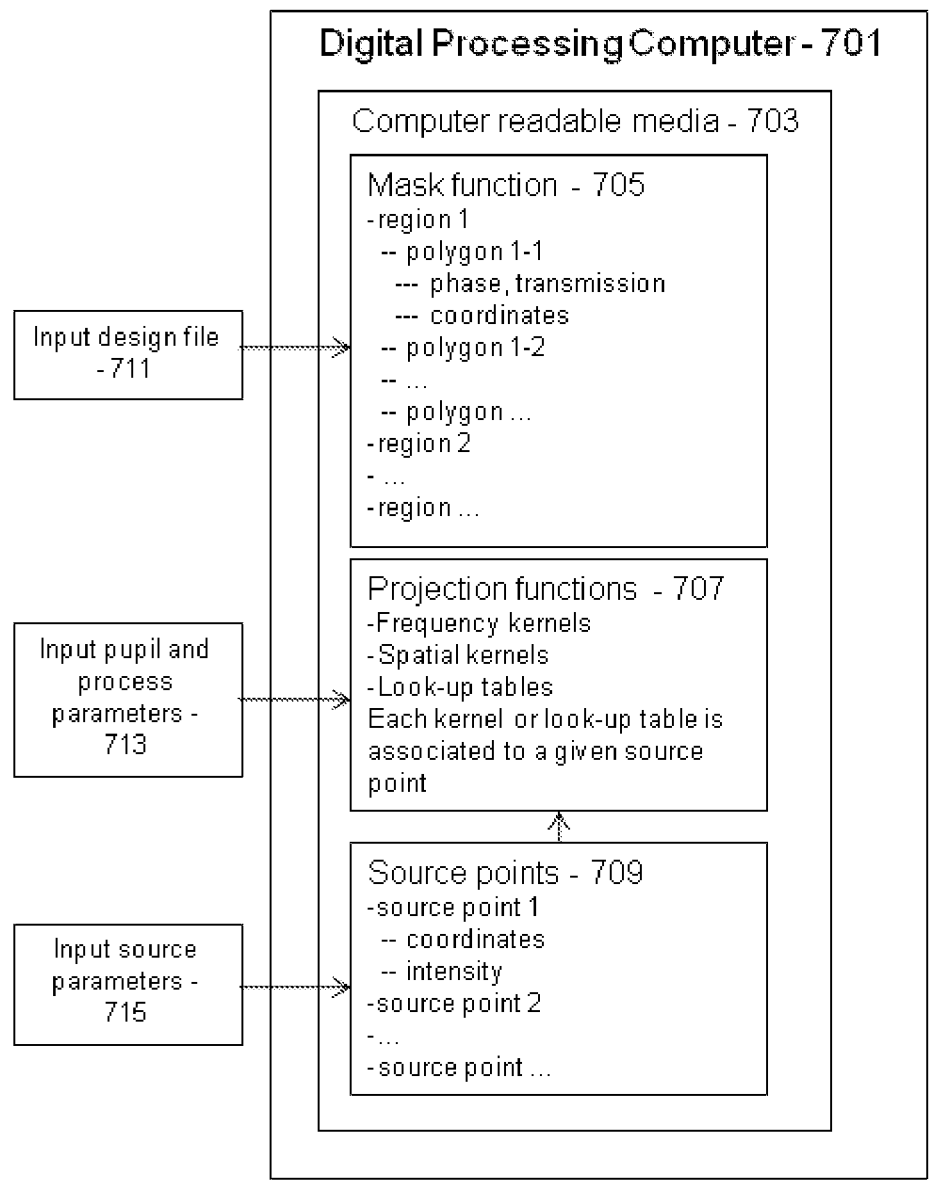
FIG. 7 is a block diagram of a computer.

The creation of the image representation of the mask can be performed (701) using a digital processing computer (701) as shown in FIG. 7. The computer readable media (703) part of the computer (701) includes the mask function description (705), the description of the projection functions (707), and the source point description (709). The mask function is created using the input design file. The mask function can be organized in different regions of the mask, each region containing one or more polygon, each polygon being described by its phase, transmission, and coordinates. The projection functions (707) are created using the source points (709) and the input files for the pupil and the process parameters (713). Example of the input parameter for the pupil would be the numerical aperture of the projection lens; example of the process parameter would be the diffusion length in the resist. The projection functions (707) can be stored in various representations in the computer readable media, for example, as spatial kernels, frequency kernels, look-up tables or as a combination of the above. A typical representation of the kernels and look-up tables (not shown in FIG. 7) would be a list of spatial or frequency points described by their coordinates and a complex number associated with each spatial or frequency point. Each kernel or look-up table is associated with one source point. The source points (709) are represented by the source coordinates and the source intensity for each point. These points are created using the input source parameters (715). For example the input source parameters could be: annular illumination, inner sigma=0.5, outer sigma=0.8, source intensity=1.

A novel simulation technique was developed to achieve high speed and accuracy, and ease of change of the optical parameters. This method has the speed advantage of the TCC decomposition method as it relies on simple convolutions of the mask function with kernel functions. It also has the accuracy and flexibility advantage of the source integration method as these kernels are associated with a given source location. The computation of the image to create an image representation is given by formula (1):

$$I_n(x', y', z', z_0) = \sum_{i=1}^{N} s_i |k_{i,n}(x', y', z', z_0) \otimes m_i(x', y')|^2 \qquad (1)$$

where $I_n(x',y',z',z_0)$=intensity inside the resist, x' and y' are the coordinates at the wafer plane, z' represents the position inside the resist film and $z_0$ the focal plane position, i=index of source point i, n=coordinate of the electrical field inside the resist=x', y', or z', N=total number of source points, $k_i(x',y',z',z_0)$=kernel function corresponding to the source point i, $m_i(x',y')$=actual mask transmission function when the mask is illuminated by the source point i (the original mask image is scaled in the x and y directions, with x and y representing the coordinates at the mask level, in order to represent the mask using x' and y', the coordinates at the wafer level), and $s_i$ is the source intensity at source point i.

Such computation can also be performed in the frequency domain where the convolution of the mask and the kernels can be replaced by the product of the mask Fourier transform by the kernel Fourier transform. In a more general sense, at least one function corresponding to a source region is used to compute the image. One example of such function is the kernel in the spatial domain $k_i(x',y',z',z_0)$ or the kernel in the frequency domain (i.e. the Fourier transform of the kernel in the spatial domain).

In the most general case the function $m_i(x',y')$ depends on the source point i. The computation can be simplified if the mask function can be replaced by a function independent of the source point i. This simplification can be done readily when the Kirchhoff or thin mask approximation is made as $m_i(x',y')$ can be replaced by $m(x',y')$ which is the transmission function of the mask using directly the transmission coefficient of the mask material. For example in the case of a binary mask the transmission function of the mask is equal to one where the mask is clear and is equal to 0 where the mask is opaque.

For a more rigorous calculation of the mask effects, $m_i(x',y')$ can be calculated using formula (2):

$$m_i(x',y')=m(x',y') \otimes mte_i(x',y') \qquad (2)$$

where $m_i(x',y')$=actual mask transmission function when the mask is illuminated by the source point i, $m(x',y')$=mask transmission function with Kirchhoff approximation and $mte_i(x',y')$=mask transmission error function for source i.

Using the previous equation, the intensity inside the resist can be computed using formula (3):

$$I_n(x', y', z', z_0) = \sum_{i=1}^{N} s_i |k'_{i,n}(x', y', z', z_0) \otimes m(x', y')|^2 \qquad (3)$$

With:

$$k'_{i,n}(x', y', z', z_0) = k_{i,n}(x', y', z', z_0) \otimes mte_i(x', y') \qquad (4)$$

The formula (4) shows that if desired the mask effects described above can made part of the kernel calculation. Moreover the mask transmission function with Kirchhoff approximation can be used for all the source points thereby simplifying the calculation. In the frequency domain, the previous equation would reduce to a multiplication of the kernel in frequency by the Fourier transform of the mask transmission error function.

Since the convolution is a linear operation the mask can be decomposed into simpler shapes and the convolutions to simpler shapes can be pre-computed and stored in look-up tables. The calculation of the image can then be performed by using the look-up table results and is therefore drastically improved in terms of speed. For example the convolution is computed by adding and subtracting the value of a quadrant function for each vertex of a layout. An example of quadrant function in the case of a dark field binary mask can be a function defined as equal to 1 if x and y are positive and equal to 0 otherwise.

Figure 8:
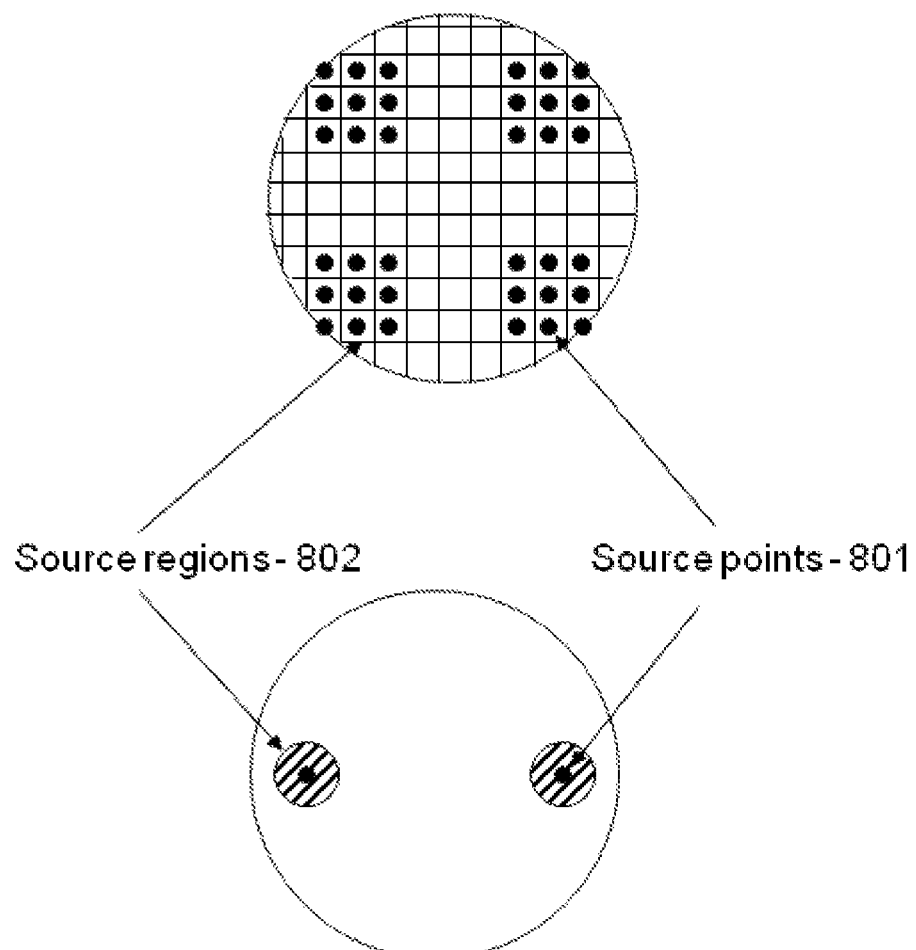
FIG. 8 illustrates how the source points are associated to a given source region.

Each source point can be associated to the actual location of the source or to a source region around the source point. In one embodiment each source point represents a given source location as shown in FIG. 8. The source points can be regularly placed as shown in at the top of FIG. 8 or placed according to specific source regions, as shown at the bottom of FIG. 8. An example of source points (represented by black dots) is given in 801, an example of source regions is given in 802. The source regions at the top of FIG. 8 are squares around the source points while the source regions at the bottom of FIG. 8 are disks (shown as shaded regions).

The computation of the intensity inside the resist requires in the most general case the computation of the intensity created by each component n (n=x', y', or z') of the electrical field inside the resist. The resulting intensity is the sum of the intensity created by each component of the electrical field.

Each point of the source i is associated with a kernel $k_i$, $k_i$ is given by formula (5):

$$k_{i,n}(x',y',z',z_0) = FT^{-1}(P_{i,n}(\alpha'-\alpha_i,\beta'-\beta_i,z',z_0)) \quad (5)$$

where $FT^{-1}$ represents the inverse Fourier transform, $P_{i,n}$ represents the effective pupil function for the coordinate n of the electrical field inside the resist corresponding to the source point i, $\alpha'$ and $\beta'$ are the coordinates in the pupil plane, $\alpha$ and $\beta$ are the coordinates in the source plane and $\alpha_i$ and $\beta_i$ are the coordinates the source point in the source plane.

As compared to the TCC formulation, the simulation methodology does not require computation of an SVD (Singular Value Decomposition), thereby saving computing time.

The effective pupil includes physical effects related to the pupil of the projection lens as well as other effects like vector effects and thin film effect that can be described in pupil coordinates. This concept allows for effects not related to the pupil of the projection lens to be modeled as part of an effective pupil if these effects can be described in the pupil coordinate system. Such effect that can be added to the effective pupil is wafer topography effect.

The chemistry of the positive tone resists used for 248 nm and 193 nm wavelength lithography is based on the use of a polymer insoluble in the developer and a photo-acid generator. Upon exposure the photo-acid generator will create an acid that will catalyze a reaction during the post-exposure bake where the polymer will be rendered soluble. The baking process ensures that one acid group will react with more than one polymer site as diffusion will occur inside the resist film thereby increasing the sensitivity of the resist (i.e. reducing the dose required to render the resist soluble in the exposed areas). At the same time the diffusion occurring during the bake process will tend to blur the image created inside the resist. In order to model diffusion effects such as for example resist diffusion effects during the post-exposure bake, the kernel $k_i$ can be computed using formula (6):

$$k_{i,n}(x',y',z',z_0) = FT^{-1}(P_{i,n}(\alpha'-\alpha_i,\beta'-\beta_i,z',z_0) \cdot G(\alpha',\beta')) \quad (6)$$

The function G can be for example a linear combination of Gaussian and Lorentzien functions. Preferably the function G is a single Gaussian function. Typical range of the resist diffusion effects is on the order of 10 to 20 nanometers.

Some flare effects can also be simulated using the same formula as for diffusion models. The range of the effects is much larger (on the order of one micron to tens of micron or even hundreds of microns) and is usually represented by more than one function like for example a Gaussian function. Some dry etch effects can also be simulated using a similar formulation.

The effective pupil $P_{i,n}$ can be computed using for example the following formulation based on a matrix formulation given in formula (7):

$$P_i(\alpha',\beta',z_0,z') = M_F(\alpha',\beta',z')M_P(\alpha',\beta')J(\alpha',\beta')S_i\Psi(\alpha',\beta';z_0) \quad (7)$$

where
$P_i$ is effective pupil matrix, $$P_i(\alpha',\beta',z_0,z') = \begin{bmatrix} P_{i,x'}(\alpha',\beta',z_0,z') \\ P_{i,y'}(\alpha',\beta',z_0,z') \\ P_{i,z'}(\alpha',\beta',z_0,z') \end{bmatrix}$$

$M_F$ is the matrix corresponding to the thin film effects, $$M_F(\alpha',\beta',z') = \begin{bmatrix} F_S(\alpha',\beta',z') & F_P(\alpha',\beta',z') & 0 & 0 & 0 \\ 0 & 0 & F_S(\alpha',\beta',z') & F_P(\alpha',\beta',z') & 0 \\ 0 & 0 & 0 & 0 & F_{zP}(\alpha',\beta',z') \end{bmatrix}$$

$M_P$ is the matrix corresponding to the vector effects, $$M_P(\alpha',\beta') = \begin{bmatrix} V_{xxS}(\alpha',\beta') & V_{yxS}(\alpha',\beta') \\ V_{xxP}(\alpha',\beta') & V_{yxP}(\alpha',\beta') \\ V_{xyS}(\alpha',\beta') & V_{yyS}(\alpha',\beta') \\ V_{xyP}(\alpha',\beta') & V_{yyP}(\alpha',\beta') \\ V_{xzP}(\alpha',\beta') & V_{yzP}(\alpha',\beta') \end{bmatrix}$$

J is the Jones matrix corresponding to polarization effects, $$J(\alpha',\beta') = \begin{bmatrix} J_{xx}(\alpha',\beta') & J_{xy}(\alpha',\beta') \\ J_{yx}(\alpha',\beta') & J_{yy}(\alpha',\beta') \end{bmatrix}$$

$S_i$ is the source polarization matrix, $S_{i,x}$ and $S_{i,y}$ represent the coordinate of the polarization vector of the source point i, $$S_i = \begin{bmatrix} S_{i,x} \\ S_{i,y} \end{bmatrix}$$

Ψ is the scalar function corresponding to scalar effects, $$\Psi(\alpha', \beta'; z') = T'(\alpha', \beta')\exp\left(-i\frac{2\pi}{\lambda_0}N'\gamma' z'\right)\exp\left(-i\frac{2\pi}{\lambda_0}W(\alpha', \beta')\right)\sqrt{\frac{\gamma}{\gamma'}}$$

$\lambda_0$=wavelength of the light in vacuum,
N'=refractive index of the fluid between the projection lens and the resist, $$\gamma = \sqrt{1-\alpha^2-\beta^2} \quad \gamma' = \sqrt{1-\alpha'^2-\beta'^2}$$

W=pupil aberration function, and
T'=pupil function, defines the extent of the pupil.

To account for pupil apodization or pupil filtering another term can be added to the pupil function as shown in formula (8):

$$P_{i,n\text{-}with\text{-}filter}(\alpha',\beta',z_0,z')=P_{i,n}(\alpha',\beta',z_0,z')F(\alpha',\beta') \quad (8)$$

where F is a filter corresponding to the apodization function or to the pupil filtering function.

The Jones matrix J can take into account a combination of the following effects: the projection lens polarization effects, the pellicle polarization effects and the mask birefringence effects. J can be given by formula (9):

$$J(\alpha',\beta')=J_{Pr}(\alpha',\beta')J_{Pe}(\alpha',\beta')J_B(\alpha',\beta') \quad (9)$$

where $J_{Pr}$=Jones matrix corresponding to the projection lens, $J_{Pe}$=Jones matrix corresponding to the pellicle effects and $J_B$=Jones matrix corresponding to the mask birefringence effects.

Depending on the modeling requirements and tradeoffs (i.e. accuracy versus speed), the computation of the effective pupil function can be simplified. For example if the polarization effects are negligible, the matrix J can be removed. Another example in the case of scalar approximation, only the scalar term Ψ can be kept and only one Kernel is generated per source point. The effective pupil is given by formula (10):

$$P(\alpha',\beta',z_0,z')=\Psi(\alpha',\beta',z_0) \quad (10)$$

And the image intensity is given by formula (11):

$$I(x', y', z_0) = \sum_{i=1}^{N} s_i |k_i(x', y', z_0) \otimes m_i(x', y')|^2 \quad (11)$$

Figure 9:
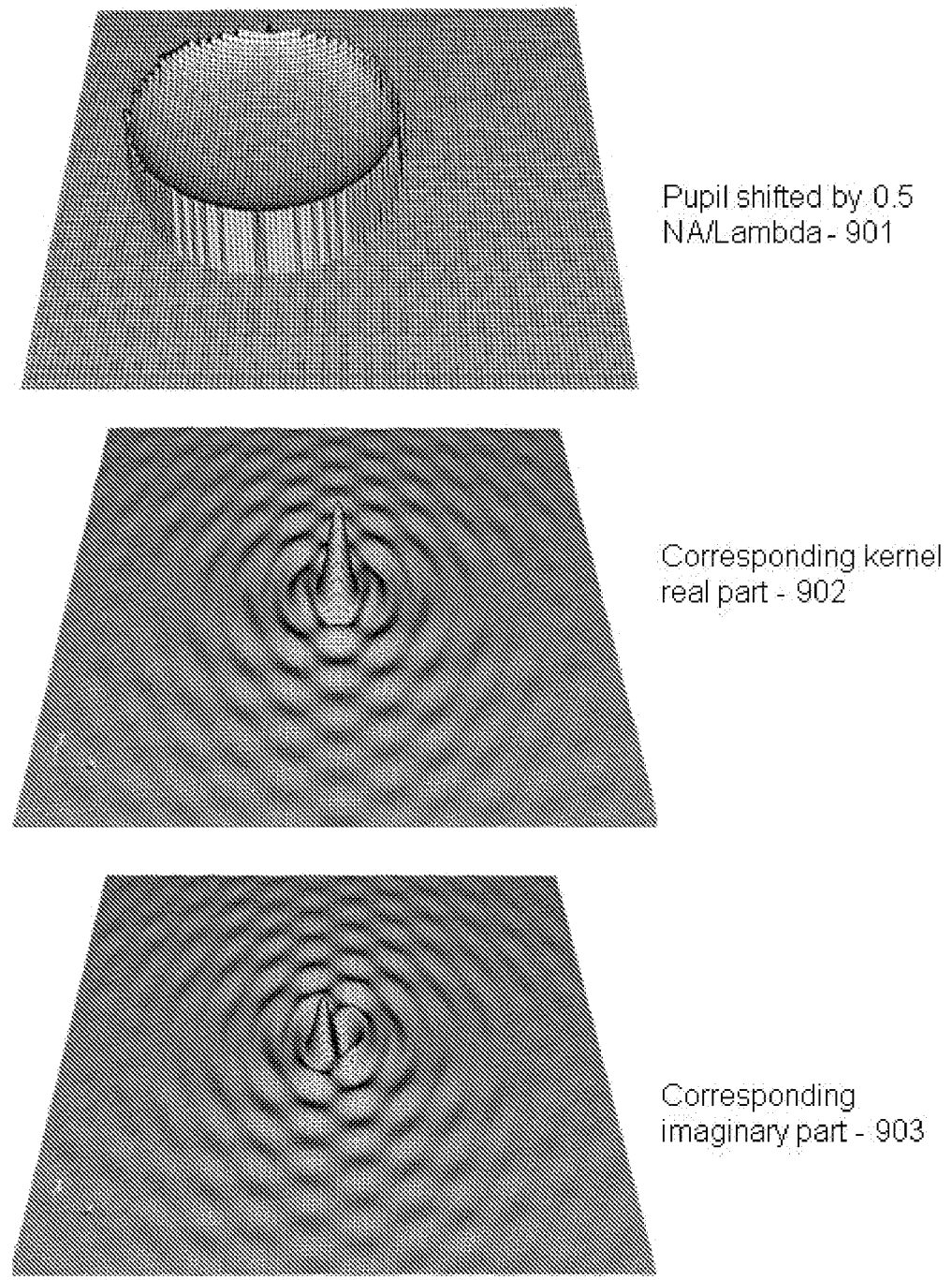
FIG. 9 shows an example of a kernel obtained using a pupil function.

An example of the kernel computation is given in FIG. 9. 901 is a graph showing the pupil. Based on the source information, the pupil was shifted by 0.5 along the horizontal axis. The kernel obtained from the effective pupil function is complex, its real part is 902 and its imaginary part is 903. For FIG. 9, the computation of the kernel assumes a numerical aperture of 1.35, a wavelength of 193 nm, zero defocus, and a source point offset by 0.5 along the horizontal axis. Only scalar effects were taken into account.

To account for loading effects an additional term can be added to the intensity calculation as shown in the following formula (12):

$$I_{w/loading}(x, y, z', z_0) = I_n(x, y, z', z_0) + \sum_{k=1}^{M} g_k(x, y) \otimes m_i(x, y) \quad (12)$$

where k=index of loading kernels and $g_k$=loading kernel k.

The loading kernels $g_k$ could be chosen from a set of Gaussian or Lorentzian functions.

To account for the resist thickness effects the intensity can be computed as the linear combination of the intensity computed for different depth inside the resist z'.

To account for defocus effects the intensity can be computed as the linear combination of the intensity computed for different defocus values $z_0$.

To account for both resist and defocus effects the intensity can be computed as the linear combination of the intensity computed for different values of defocus $z_0$ and different depth inside the resist z'.

Figure 10:
FIG. 10 shows a list of the effects taken into account in one form of kernel computation.
Figure 11:
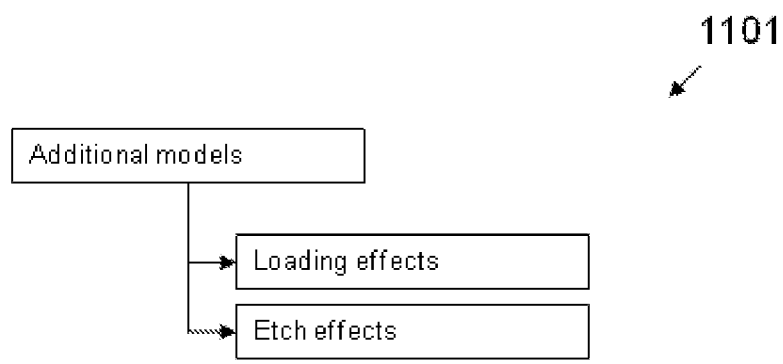
FIG. 11 shows a list of other effects taken into account during the computation of an image.

FIG. 10 provides a summary 1001 of all the effects taken into account in the computation of the kernel in one embodiment. Additional effects taken into account in the computation of the images are given as a summary 1101 in FIG. 11.

The computation of the images as described above can be used to create one or multiple simulations of a given mask image. From the simulation results, the dimension of the resist patterns can be computed. The process latitude of the image as defined by a combination of the dose and focus latitude can be computed. The slope of the image at a given point in the image or across the image can also be computed. Alternatively the normalized image log-slope can be computed, where the log slope is computed for a given feature and normalized by the feature size. The mask error enhancement factor (MEEF) as defined below (formula (13)) can also be computed.

$$MEEF = \frac{\partial(\text{Wafer}\cdot\text{Dimension})}{\partial(\text{Mask}\cdot\text{Dimension} @ 1X)} \quad (13)$$

The computation results can also be used to make decisions on the optimum mask to be used like for example binary mask versus phase-shifting mask. Decision on the exposure conditions can also be made like for example the numerical aperture of the projection lens, the illumination setting (i.e. on-axis versus off-axis illumination) of the source, the defocus, the choice of the resist, the resist parameters (for example the resist thickness), the substrate parameters (layer types and thicknesses). The substrate parameters can be modified for example to reduce the light reflection from the substrate; an optimum anti-reflective coating can be calculated for example.

When small feature sizes (compared to the source wavelength) are printed, the design shapes must be modified in order to print the desired images on the wafer. These modifications account for the limitation in the lithography process. One such modification is referred to as Optical Proximity Correction (OPC) in the case of optical lithography. In the case of OPC, modifications of the design image account for optical limitations as well as mask fabrication limitations and resist limitations (due for example to diffusion). Modifications of the design image can also account for the proximity effects of subsequent process steps like dry etching or ion implantation. It can also account for flare in the optical system as well as loading effects induced by pattern density variations. Another application of proximity effect correction is the compensation of the effects of aberrations of the optical system used to print the image of the mask onto the wafers. In this case, a mask with aberration correction would be dedicated to a given lithography tool as the aberrations are tool-specific. Similarly, another application of proximity effect correction is the compensation of polarization effects of the optical system used to print the image of the mask onto the wafers. In this case, a mask with polarization effect correction would be dedicated to a given lithography tool as the polarization effects are tool-specific.

The image quality can be improved by adding printing or non-printing assist features along the edges of the main features. These assist features modify the diffraction spectrum of the pattern in a way that improves the printing of the main feature. The practical implementation of assist features is enhanced with the use of proximity effect correction to correct for any optical printing artifact as well as resist and etch artifacts. Assist features can be placed on the layout pattern based on a set of rules governing the size and the position of the assist features with respect to the main feature. Assist features can also be placed on the layout based on an assessment of the image quality using a model-based simulation of the image. Other approaches to model-based placement of assist features based on the computation of simplified images have also been proposed.

Ultimately the mask image could be created by applying an inverse transformation to the target wafer image. The lithography process can be represented by a forward operator F where the image on the wafer W is equal to F(M) where M is the mask function. The problem of inverse lithography is to find a solution of M to this problem when the wafer image W represents the target wafer image T; i.e. we need to solve the following equation by computing M: T=F(M). F can be seen as a low pass filter of the mask pattern spatial frequencies, therefore this equation does not have a solution if T contains spatial frequencies higher than the cut-off frequency of the function F. The solution of this equation can be derived using optimization technique by defining a cost function that need to be minimized like for example the difference between F(M) and T. Constraints used during the optimization could include the process latitude as defined for example by the dose and focus latitude, the wafer image slope.

The image quality can also be improved by using phase-shifting masks. The mask structures were described earlier. In this case, at least two different regions are created on the masks corresponding to different phase and amplitude of the light either going through these regions (for transparent mask) or reflected by these regions (for reflective mask). The destructive interference between adjacent regions of opposite phase creates a very sharp contrast at the boundary between the regions, thus leading to the printing of small features on the wafer. The practical implementation of phase-shifting masks is improved with the use of proximity effect correction as described above to correct for any optical printing artifact as well as resist and etch artifacts. Phase-shifting mask can also be used in combination with assist features.

The image quality can be improved by using off-axis illumination. To achieve off-axis illumination, the illuminator of the stepper or scanner is modified such that only the light at certain angles with respect to the optical axis is used to create the image thereby favoring specific spatial frequencies of the mask pattern. The off-axis setting can be adjusted for a given feature size and type or for a collection of feature sizes and types. Off-axis illumination can be used in combination with binary masks, attenuated phase-shifting masks, or rim phase-shifting masks. The implementation of off-axis illumination is also be improved by the use of proximity effect correction as described in a previous paragraph. Off-axis illumination can also be combined with the use of assist-features. As the mask pattern can drastically vary across a given mask layout from isolated to dense pattern, from small feature sizes to larger feature sizes, off-axis illumination can be carefully tuned to a given mask layout thereby creating what is referred to as "customized illumination".

Figure 12:
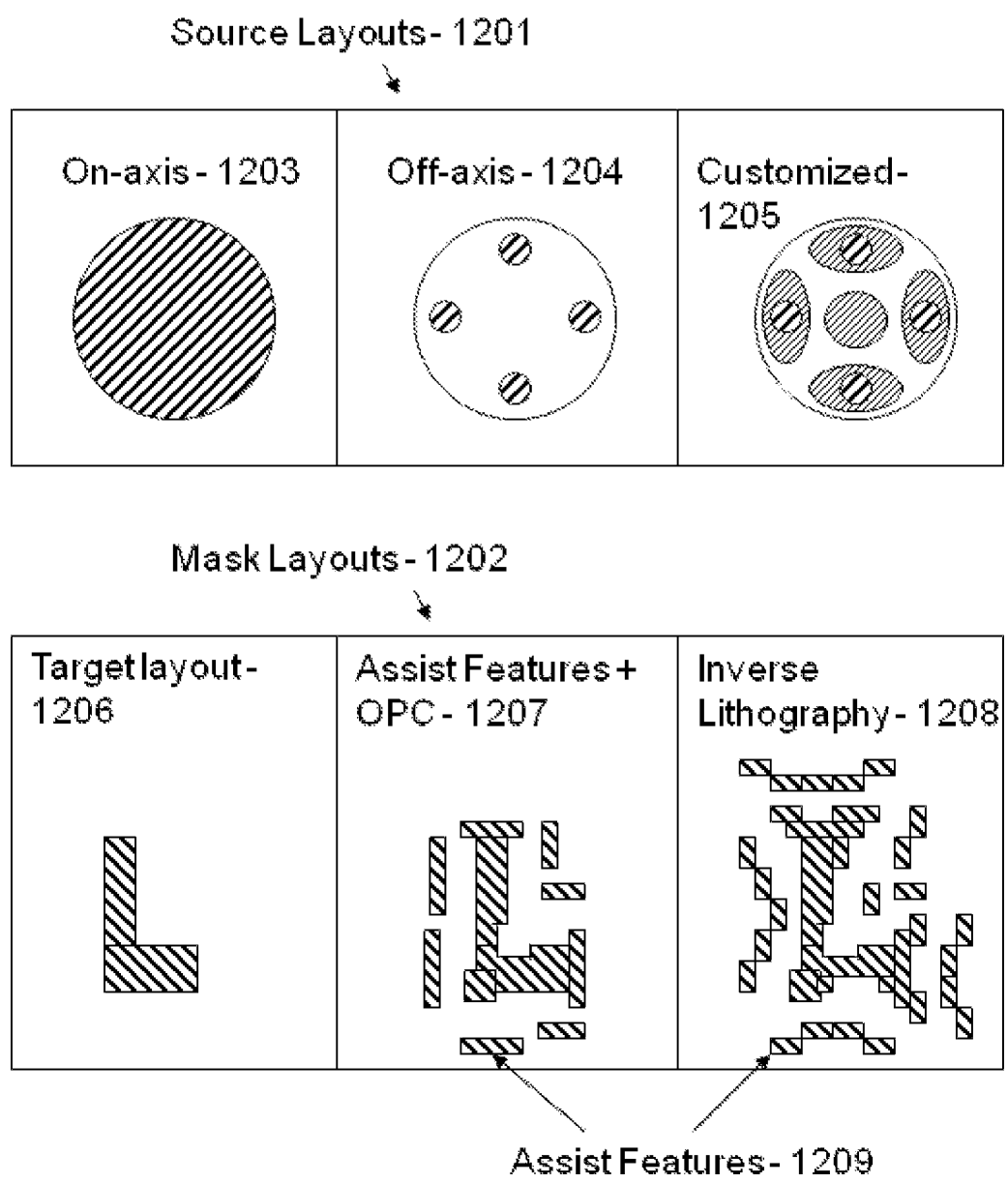
FIG. 12 illustrates some of the approaches related to source and mask optimization.

The illumination optimization for a given layout is limited by the fact that as the illumination is optimized the mask layout need to be changed to account for proximity effect correction. Therefore, the performance of the optical system can be further improved when a careful optimization of both the mask layout and the source layout are applied which is referred to as source-mask optimization. An illustration of some of the approaches related to source and mask optimization is given in FIG. 12. The source layout options (1201) shown are on-axis illumination (1203), off-axis illumination (1204, an example here of a 4-pole illumination) and customized illumination (1205). The lightly shaded regions are lower transmission than the darker shaded regions. The mask layout options (1202) are the original target layout (1206), the layout after placement of assist features and OPC (1207), and the layout after inverse lithography (1208). Assist features 1209 are also shown for both layouts 1207 and 1208.

Current exposure tools have a limitation in source size (sigma as defined as the ratio between the numerical aperture of the condenser lens and the numerical aperture of the projection lens) and numerical aperture of the projection lens (NA=Numerical Aperture). For a given optical system, all possible source points can be calculated with a disk of radius equal to the maximum sigma value. For each source point each possible polarization (i.e. x and y polarization) can be computed. Therefore a complete model of the system for a given NA can be created for a fixed film stack of the wafer. Moreover the value of the numerical aperture can be varied from the minimum possible value to the maximum possible value. For each NA, all the source points can be calculated. Therefore it is possible to completely model all possible values of NA and sigma for a given lithography tool for a fixed film stack on the wafer. In the most general case, a source point can be associated with six kernels: three kernels corresponding to the x, y, z components of the electrical field for a source polarized in the x direction and three kernels corresponding to the x, y, z components of the electrical field for a source polarized in the y direction. If the source polarization is a combination of the x and y polarizations weighted by the respective coefficients wx and wy, the image calculated using the three kernels corresponding to the x, y, z components of the electrical field for a source polarized in the x direction can be weighted by wx and the image calculated using the three kernels corresponding to the x, y, z components of the electrical field for a source polarized in the y direction can be weighted by wy to compute the resulting image. The computation can be simplified by computing only the x and y components of the electric field and neglecting the z component.

The exposure tool complete model for all values of NA and sigma can be used for custom illumination computation or for source mask optimization. The concept of source-mask optimization can be further extended to optimizing the source, the mask, and the projection lens NA at the same time as the NA can also be varied. The complete model can also be used to optimize the exposure tool setting for a given mask layout.

When inverse lithography, source-mask optimization, or source-mask-NA optimization are performed, the mask layout can be restricted to shapes that can be manufactured using available mask write tool. Restriction can be placed on the output mask design such as minimum feature sizes.

Figure 13:
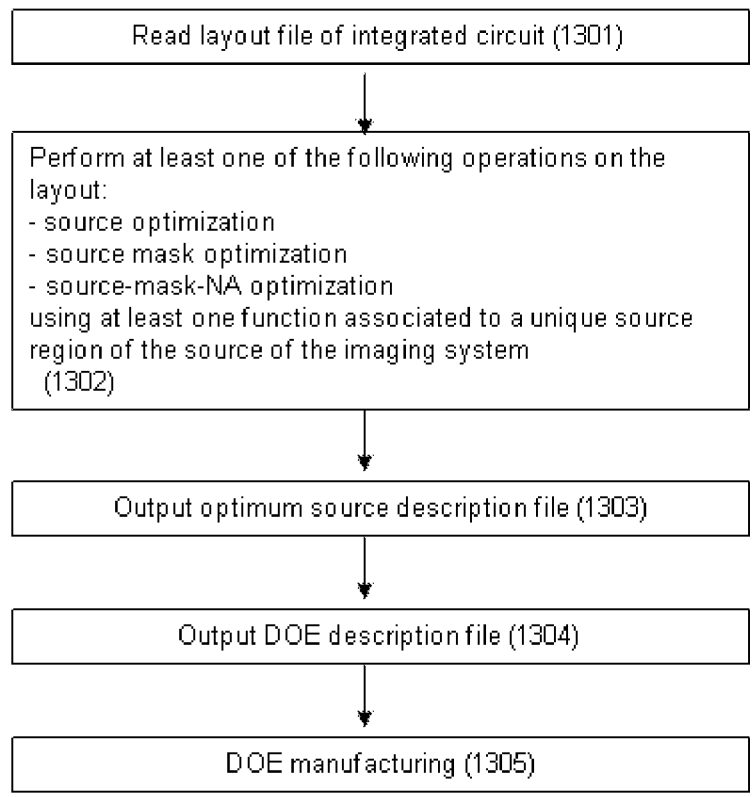
FIG. 13 is a flow chart for a process of creating a DOE.

When an optimum source is defined using the simulation method described above, a Diffractive Optics Element (DOE) can be manufactured and inserted inside the stepper or scanner to produce a source illumination reproducing the optimum source illumination. FIG. 13 shows a flow chart describing the creation of the optimum DOE for a given layout file. First a mask layout file is read at step 1301. At least one of the following operations is performed on the layout file at step 1302: source optimization, source mask optimization, source-mask-NA optimization; using at least one function associated to a unique source region of the source of the imaging system. Based on the results of step 1302, an optimum source description file is created at step 1303. An optimum source description file includes the coordinates and the source intensity for each source point. Based on the source description file of step 1303, a DOE description file is created at step 1304 as know in the art. The DOE description file gives a representation of the phase diffraction grating needed to re-create the desired source intensity map of step 1303. Ultimately the DOE is manufactured (step 1305) using for example a transparent substrate coated with a sensitive resist and a direct-write exposure tool using a process similar to the process used for mask fabrication. Alternatively an intermediate layer can be coated on the transparent substrate, the sensitive resist being coated thereafter. This intermediate layer can be used to alleviate charging effects during exposure but it can also be used as a hard-mask for etching the transparent substrate: the resist mask can be first transferred into the intermediate layer to form an intermediate layer mask; the intermediate layer mask can then be used to transfer the final image into the transparent substrate.

The computation of the image can be simplified by taking advantage of the fact that the convolution is a linear operation. Therefore the mask can be decomposed into simpler shapes for example by adding and subtracting quadrants (=1 if x and y>0, =0 otherwise) for a layout with polygon edges oriented in either x or y direction. A look-up table can be created by convolving the kernels to the quadrants. The calculation of the image is then performed by using the look-up table results and is therefore drastically improved in terms of speed. If the mask layout includes more than x and y oriented polygons, additional look-up tables need to be created. Each additional angle like for example 45 degree angle will be associated to an additional specific look-up table. Alternatively, if the mask layout data comprises too many different angles, the data can be approximated to angles supported by the look-up table in order to perform the simulation.

The accuracy of the models when compared to actual wafer measurements can be further improved by adjusting the available model parameters to minimize the difference between simulation and experimental data. A calibrated simulation model is thereby created.

Short range etch effects (typically less than a few microns) can be simulated by applying a bias to the layout corresponding to the difference between the resist image and the etch image. The bias applied can be a function of the feature size, type, and its environment. It can also be calculated at a given location based on the concentration of neutral species at that specific location. During the etch process, the concentration of neutral species in the plasma at a given location will depend greatly on the area of material being etched around that specific location. A model of the etch bias can therefore be created based on the area of material being etched.

This new modeling approach can also be used in the design phase of the integrated circuits to verify the manufacturability of the design before actually manufacturing the corresponding integrated circuits. If the manufacturability is not sufficient the design can be modified in order to improve it. The verification and correction of the design can be done for all the cells of a standard cell library thereby creating more manufacturing robust standard cell libraries. The verification and correction can also be done at the time the place and route software tool places and connects the cells. The verification and correction of the design can also be done when random layouts are being generated. A designed verification tool can be a standalone tool getting the design as input and creating an output comprising a list of errors and their location. For each error a proposed correction of the design could also be given. Such design verification tool can also be integrated to other design automation tools such as layout editing tools or design rule verification tools.

Figure 14:
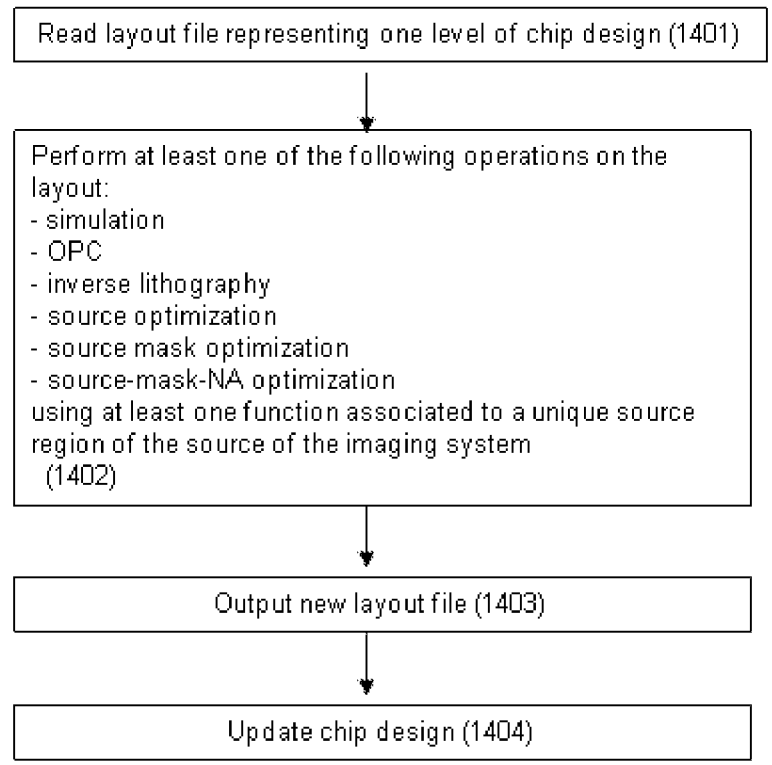
FIG. 14 is a flow chart for a process of verifying a chip design.

FIG. 14 shows a flow of the method for verifying and correcting a chip design. At step 1401, a layout file representing one level of the chip design is first read using a computer system such as described in FIG. 15. The creation of such a layout file representing a given chip level based on the chip design may require a combination of the following operation between the original layers of the design: sizing or Boolean operations. At step 1402, at least one operation is performed on the layout. These operations include the simulation of the layout, OPC, inverse lithography, source optimization, source-mask optimization, and source-mask-NA optimization. These operations are performed using at least one function associated to a unique source region of the source of the imaging system. At step 1403, a new layout file is created. The layout file created could be the same as the original layout file if no modification of the layout was performed at step 1402. This can be the case for example if a simulation of the original layout file is performed and the manufacturability of the layout based on the simulation results was deemed acceptable so that no change to the layout was required. At step 1404 the chip design is updated using the updated layout created at step 1403. The modified layout is used to modify the corresponding design layers of a given design level and may, if desired, be stored in machine-readable memory (e.g., optical disk, solid state memory, floppy disk, hard disk, etc.) for future use.

Figure 15:
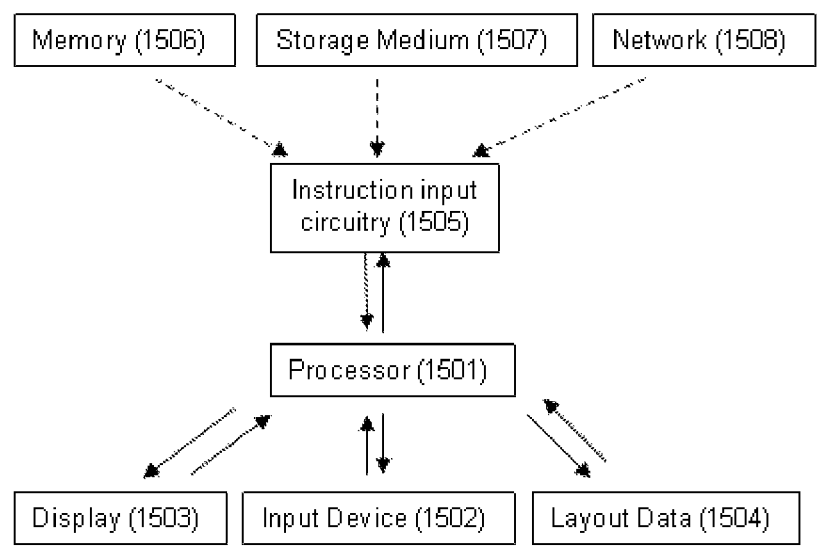
FIG. 15 is a block diagram of a computer system that uses software (i.e., instructions stored on machine-readable media) to implement teachings provided by this disclosure.

FIG. 15 illustrates a computer system that can be used to perform the computation of the lithography simulations in the context of the various applications described above or further below. This computer system represents a wide variety of computer systems and computer architectures suitable for this application. A processor 1501 is connected to receive data indicating user signals from user input device 1502 and to provide data defining images to display 1503. Processor 1501 is also connected for accessing mask layout data 1504, which define a mask layout under construction and a layout for a layer of material to be exposed using the mask. Processor 1501 is also connected for receiving instruction data from instruction input device 1505, which can provide instructions received from connections to memory 1506, storage medium access device 1507, or network 1508.

The new approach provided by this disclosure can also be used to assess the quality of the mask made by taking an image of the mask using for example an SEM (Scanning Electron Microscope) or the image of a mask created by a mask inspection tool such as the KLA mask inspection tool, simulating the corresponding printed image on the wafer and making a decision whether the mask quality, as it relates for example to the printability of defects or the control of the mask critical dimensions and the placement of such critical dimensions, is sufficient. Another option is to create an aerial image of the mask using an optical system such as the AIMS tool or the Aerial mask inspection tool and comparing the aerial image to a simulated aerial image based on the actual mask data.

In addition, the new modeling approach can be used when wafers are inspected using an SEM (Scanning Electron Microscope) and comparing the wafer printed images to the simulated images of the wafer based on the mask layout.

These new models can also be used to create exposure-tool specific models taking into account aberration and polarization effects specific to the projection lens of the exposure tool or taking into account source maps specific to the source and illuminator of the exposure tool. Such simulation can be used to verify that the exposure tool will perform within specifications. These models can also be used to tune the lithography exposure tool in order to minimize aberrations or polarization effects.

The number of kernels and the range of the kernel are defined by the source design and the accuracy requirements. The vector effects and the source polarization effects are calculated as part of the effective pupil and are therefore not a limitation of this model. Mask diffraction effects can also be made source-dependant using this technique and are therefore more accurate than the TCC implementation.

Figure 16:
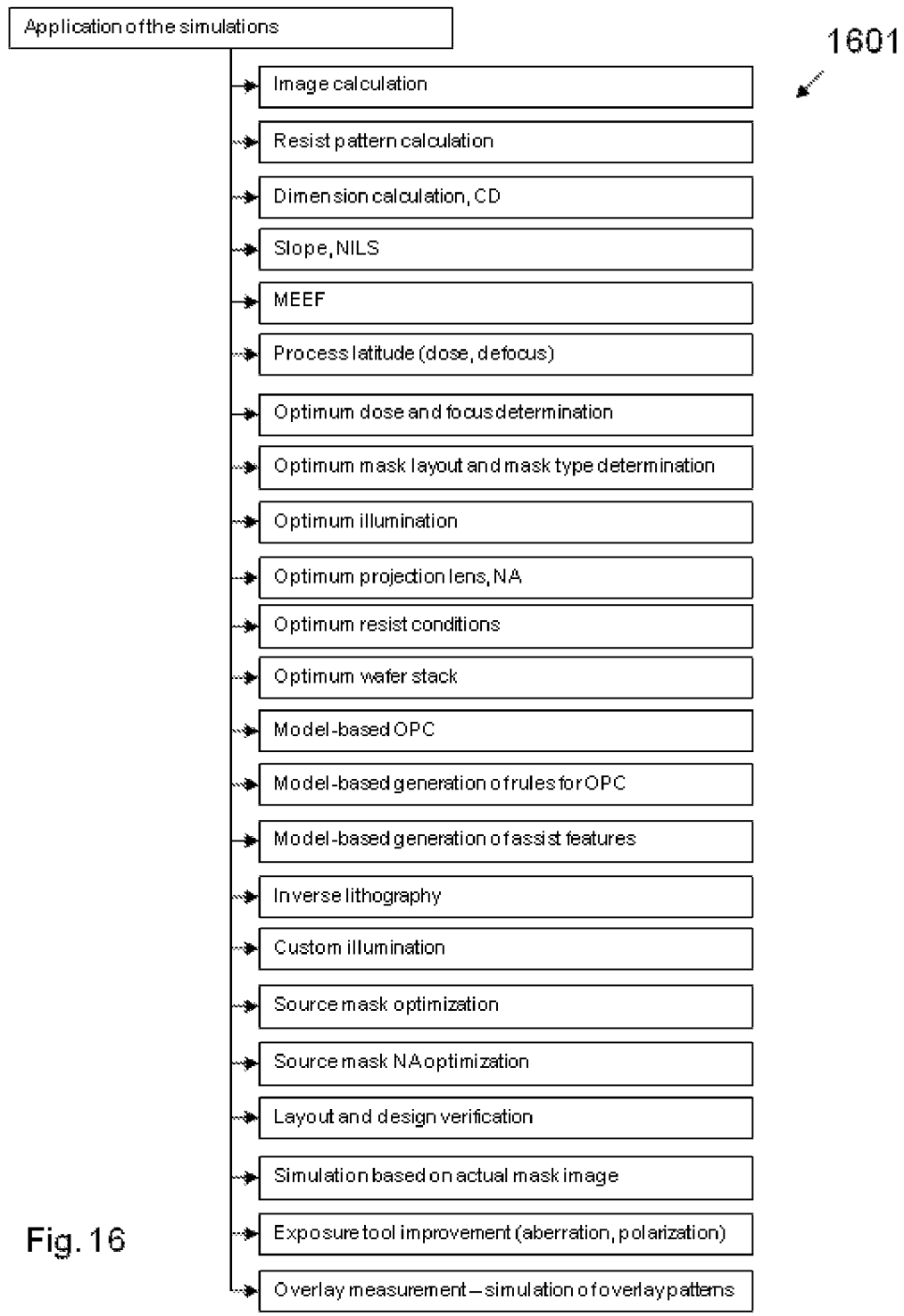
FIG. 16 shows a list of some of the possible applications of the simulation.

A summary of some of the possible uses of the techniques provided by this disclosure is given by a list 1601 in FIG. 16.

The implementation of these new models can be done by writing a software program and implementing the software program on a hardware platform. Such software program are based on software tools such as Scilab, Matlab, Mathematica, scripting languages such as Perl or Tcl, or programming languages such as Fortran, C, C++, Java. These programs may also include the use of software libraries to compute certain operations like for example the fftw libraries to compute fast Fourier transforms; the CUDA libraries to perform computation on GPUs (Graphics Processing Unit) from NVIDIA. The hardware platform includes portable device such as a portable devices, laptops, desktops, workstations, mainframe computers, a network of a combination of the above-mentioned hardware platforms, or a computer farm as defined as a large group of similar data processing units. The operating system of the hardware platform includes for example Windows XP, Windows Vista, Unix, Linux, or Apple Computer's operating systems. The hardware platform can also include one or multiple CPUs (Central Processing Units) having one or multiple cores. It can also include one or multiple GPUs (Graphical Processing Unit) or one or more specialized processing units. Such specialized processing units like for example math co-processors or FPGA (Field Programmable Gate Array) or ASICs (Application Specific Integrated Circuit) can be used to perform portions of the simulation task or the entire task. The software program can be written to utilize distributed processing and multi-threading to take advantage of multiple hardware platforms with potentially multiple CPUs having potentially multiple cores, and additionally multiple GPUs or multiple specialized processing units. Certain software tasks can be done in parallel like for example the computation of the convolutions of the kernels with the mask image or the computation of the look-up tables for each kernel. Certain tasks are better suited for GPU calculation than CPU calculation. For example fast Fourier transforms or convolutions can be performed faster on GPUs compared to CPUs.

Figure 17:
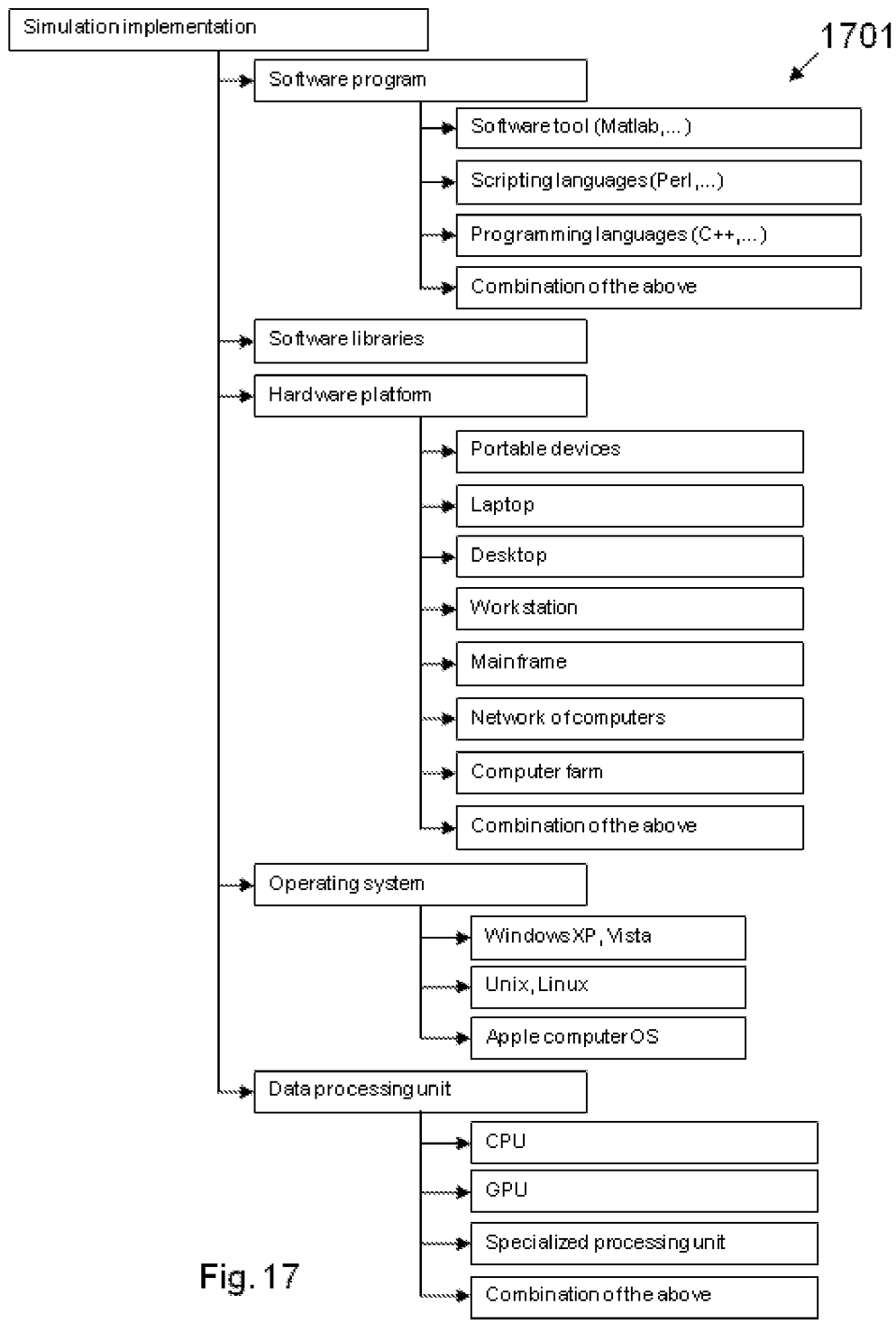
FIG. 17 shows a list of some of the possible implementations of image simulation.

A summary of some of the possible implementations is indicated by numeral 1701 in FIG. 17.

Figure 18:
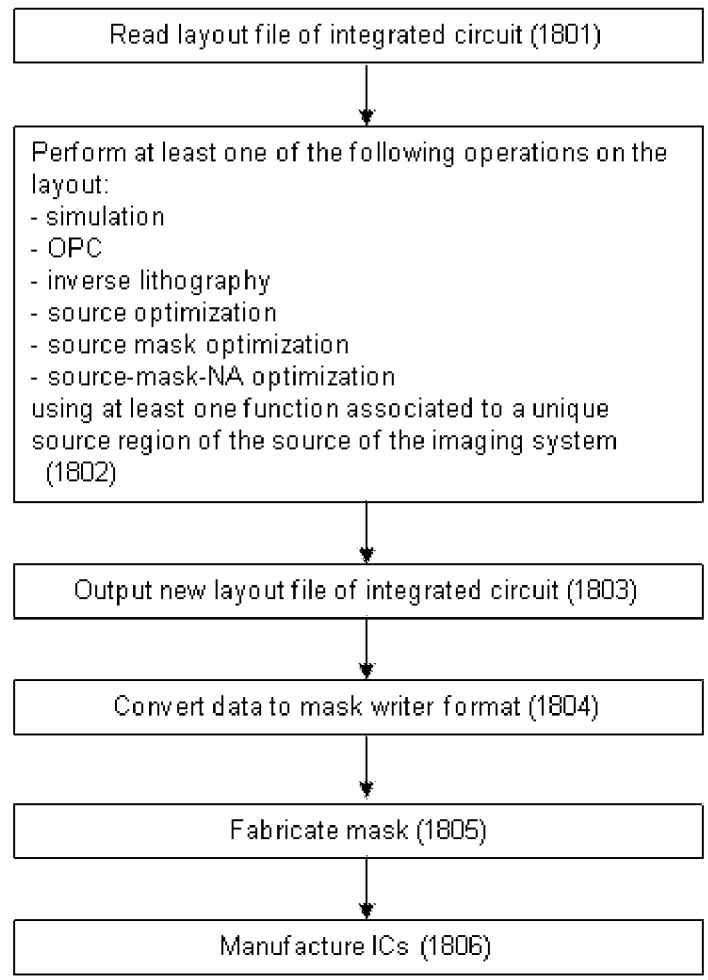
FIG. 18 is a flow chart for a process of integrated circuit manufacturing.

FIG. 18 illustrates the manufacturing process of a mask and of an IC (Integrated Circuit). At step 1801, the layout file of the integrated circuit is first read using a computer system described in FIG. 15. The format of the layout file can be for example GDSII or oasis. At step 1802, at least one operation is performed on the layout. These operations include the simulation of the layout, OPC, inverse lithography, source optimization, source-mask optimization, and source-mask-NA optimization. These operations are performed using at least one function associated to a unique source region of the source of the imaging system. At step 1803, a new layout file is created. The layout file created could be the same as the original layout file if no modification of the layout was performed at step 1802. This can be the case for example if a simulation of the original layout file is performed and the manufacturability of the layout based on the simulation results was deemed acceptable so that no change to the layout was required. The layout file may contain hierarchical data structures where a cell containing one or multiple polygons is repeated at multiple locations within the layout file. It might be advantageous to process the cell in its context (environment) and place the resulting computation back into the hierarchical tree. Multiple placements of the same cell may get the same output result and can therefore be kept in the same cell thereby avoiding an explosion of the number of unique cells after processing the layout. Alternatively the layout may be flatten (i.e. the polygons are all in the same hierarchical level) and broken down into pieces thereby allowing for more efficient processing using distributed processing. The results of all the pieces are subsequently recombined to create the output layout. The data resulting from step 1803 is converted to a mask data format at step 1804 which is subsequently used to create a mask at step 1805. The mask data format used will depend on the mask write tool that will be used to manufacture the mask. For example MEBES data format can be used for Applied Materials mask write tools like MEBES4000, VSB data format can be used for Nuflare mask write tools like EBM5000, and EBM6000. The mask is finally used in the fabrication process of an IC at step 1806.

The various software components described above could be made available to end users in different forms. End users could access the implementation set-up described above by directly accessing files stored on their own hardware equipment. For example, the software could be installed on the hard disk of their laptop or desktop.

Figure 19A:
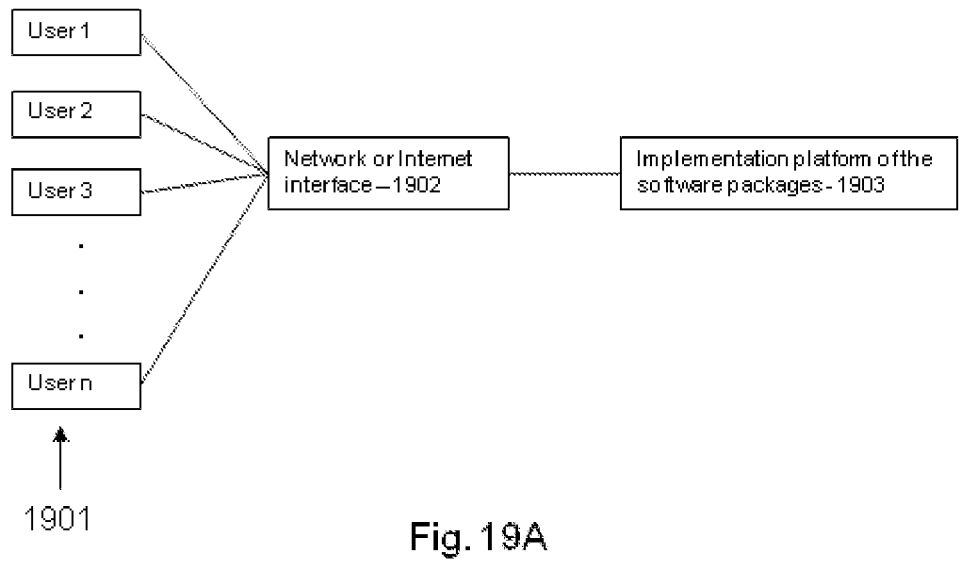
FIG. 19 illustrates some of the possible applications of software that implements teachings from this disclosure; in particular, FIG. 19A describes the case where the access to the implementation set-up or layout files (or other components) is effected via the internet (1902)
FIG. 19B illustrates a situation the design and the manufacturing of the integrated circuits are performed by two different groups that could be parts of two different companies.
Figure 19B:
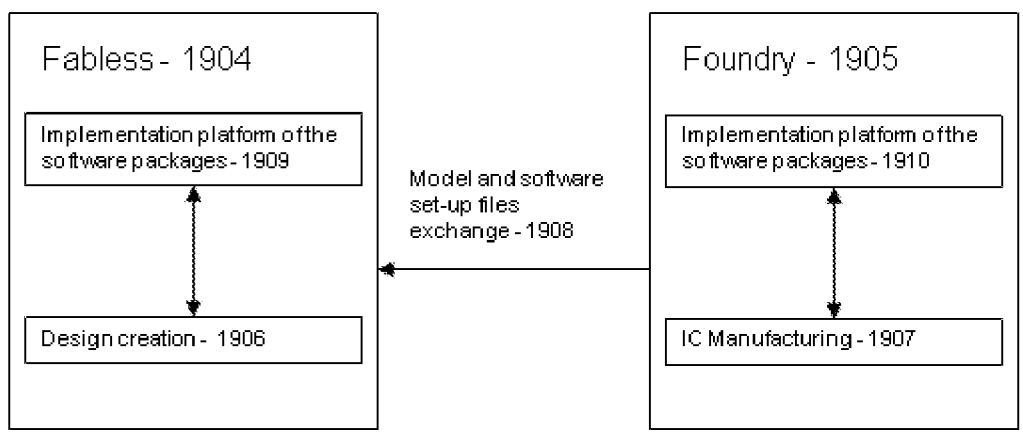

Software could also be made available through a computer network and the user would remotely access the computer or computers on which the software is installed, as shown in FIG. 19a.

FIG. 19a also describes the case where the access to the implementation set-up or layout files (or other components) is effected via the internet (1902). A user (or multiple users—1901) could use the internet to access and run the software. The set-up described in FIG. 19a allows for a better sharing of the computing resources. The user may be the owner of the implementation set-up (1903) or he could be renting the implementation set-up (or a portion thereof like for example the computer hardware) from a third party. Another consideration that may be taken into account is when the design and the manufacturing of the integrated circuits are performed by two different groups that could be part of two different companies and be located hundreds or thousand of miles apart. This is the case for example when the design is performed by a fabless company (like Nvidia, or Xilinx) and the chip corresponding to the design is manufactured by a foundry (like TSMC or UMC). The model is created by the foundry (1904) based on process parameters, the model can be used by the foundry to apply OPC for example in order to manufacture the chip (1907) and it can also be used by the fabless company (1905) to remotely verify that the design (1906) is manufacturable using software set-up file and the model (1908). An implementation platform (1910) could be implemented by the foundry and an implementation platform (1909) could be implemented by the fabless company. As the model contains sensitive process information, the software can be configured such that information may only be released by the foundry in encrypted form or in a simplified form.

CONCLUSION

The data structures and code described in this description can be stored on a computer readable storage medium, which as mentioned may be any device or medium that can store code and/or data for use by a computer system. This includes, but is not limited to, magnetic and optical storage devices such as disk drives, magnetic tapes, CD (compact discs), DVD (digital video disks), and BD (blu-ray disks), USB memory sticks, and computer instruction signals embodied in a transmission medium. For example, the transmission medium may include a communication network, such as the Internet.

These techniques can be applied to reflective masks for EUV lithography. For a reflective mask the radiation is reflected by the mask. Reflective masks are mostly used for shorter radiation wavelength on the order of 13.5 nm usually referred to as soft X-ray or EUV (Extreme Ultra Violet). The reflective masks are made using a substrate reflective to the radiation and coated with a patterned non-reflective layer defining reflective and non-reflective regions to the radiation.

Alternatively, a reflective mask could be made of a non-reflective substrate coated with a reflective layer. Reflective masks are mostly used for shorter radiation wavelength on the order of 13.5 nm usually referred to as soft X-ray or EUV (Extreme Ultra Violet). Similarly as for transparent masks, reflective phase-shifting mask could be built.

These techniques can be applied to the fabrication of integrated circuits, MEMS, integrated optics devices, or opto-electronic devices.

Figure 20:
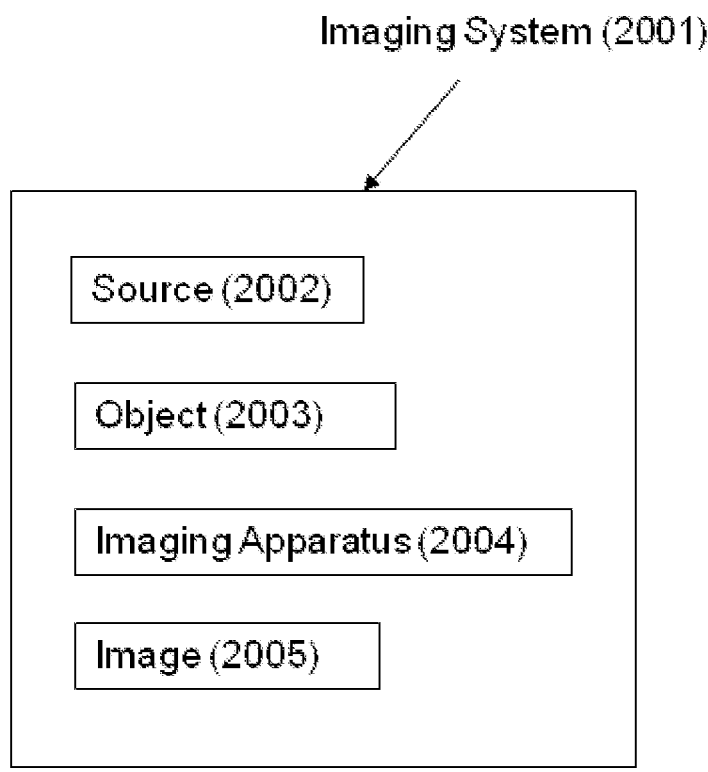
FIG. 20 is a flow chart representing an imaging system creating an image that can be computed.

FIG. 20 shows that these techniques can be applied to the more general case of the calculation of an image (2005) created by an imaging system (2001) where such imaging system creates an image of an object (2003) illuminated by a source (2002) using an imaging apparatus (2004). The calculation of the image creates a simulated image; the calculation using at least one function associated to a unique source region of the source of the imaging system. To create the simulated image of the object, a representation of the object is needed. Such representation of the object could be for example the transmission function of the object or the reflection function of the object. In particular, these techniques can be applied to the calculation of the image of an object created by an optical microscope where the object is the sample being analyzed, the illumination source is an optical light source having a wavelength ranging from 100 nm to 1000 nm, the imaging apparatus is a projection lens, and the imaged by viewed through an eye-piece, a camera, or a detector. Such microscopes are used for example in the fields of semiconductor manufacturing, biology, integrated optics, MEMS manufacturing.

These techniques can also be applied optical systems used in the measurement of overlay between two lithography levels during the fabrication of integrated circuits. Overlay is a measure of the misplacement of two lithography levels. Typically a set of marks is printed on each level. The overlay measurement is accomplished by measuring the distance between the marks corresponding to two different levels. Imaging tools similar to the one described in FIG. 8 are used. The object is the alignment marks, the imaging apparatus is a lens, and the image is captured by a detector. The signal from the detector is subsequently processed to derive the overlay.

The simulation methodology described above could also be used for other instruments such as telescopes, analog cameras, and digital cameras when a simulation of the image created by the instrument is needed.

Another application of this simulation technique is the rendering of digital images for applications such as computer animated games or videos where the computation of realistic images is needed. In this case the object could be a scene comprising multiple objects for example the interior of a house, the source could be for example a set of lamps, the sun, the moon, or a combination thereof, and the imaging apparatus could be the human eye. One of the advantages of the teachings provided above is that diffraction effects can be effectively computed thereby creating more realistic images for example in the case of very fine texture of the skins or of the clothing.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

The invention claimed is:

1. A method of building an image representation for use in semiconductor processes, applied to an imaging device that includes a radiation source and an optics device, comprising:

(a) obtaining a set of source points that collectively represent the radiation source, each source point corresponding to a source region;
(b) obtaining from a non-transitory computer-readable medium a mask function;
(c) obtaining a projection function that is dependent upon at least one source point of the set;
(d) combining the mask function with the projection function to obtain a combined result;
(e) repeating (c-d) so as to encompass each source point of the set; and
(f) aggregating at least some of the combined results to obtain the image representation;
where the optics device further comprises a lens having a numerical aperture, and where the method further comprises performing optics enhancement by
performing (f) plural times, each time for a different projection function,
storing each resultant image representation,
comparing each of the resultant associated image representations with a semiconductor mask design, and
selecting a projection function based upon the comparing.

2. The method of claim 1, further comprising performing mask optimization by comparing the image representation with a semiconductor mask design associated with the mask function to detect error, changing the semiconductor mask design associated with the mask function so as to reduce the error, and storing a modified semiconductor mask design in a digital storage device.

3. The method of claim 1, further comprising performing source optimization by performing (f) plural times, each time for a different group of combined results to represent different subsets of one or more source points of the set, comparing resultant associated image representations with a semiconductor mask design, and selecting a subset of one or more of the source points based upon the comparing.

4. The method of claim 3, where performing (f) plural times includes, for each of the plural times, storing a digital storage of an image representation for the respective different subset.

5. The method of claim 4, where:
for each of the plural times, obtaining a set includes obtaining exactly one source point, and aggregating includes outputting and storing an image representation for exactly one source region; and
comparing includes comparing multiple image representations associated with plural, different source regions with the semiconductor mask design.

6. The method of claim 1, where performing (f) plural times, each time for a different projection function includes varying a numerical aperture associated with each projection function.

7. The method of claim 1, where obtaining a set of one or more source points includes defining a grid having multiple source regions, and selecting the set to be a subset of one or more of the source regions.

8. The method of claim 1, where obtaining the mask function includes loading a mask layout file and computing a mask transfer function from the mask layout file.

9. The method of claim 8, further comprising:
receiving a polygon from the computer readable layout file, the polygon corresponding to a portion of an integrated circuit; and
performing using a digital processing computer processor a computation of the placement of one of the edges of the polygon using at least said projection function and said mask transfer function to provide a computer readable corrected layout file comprising a modified set of polygons.

10. The method of claim 9, further comprising separately storing a plurality of corrected layout files, each layout file corresponding to a different portion of the integrated circuit.

11. The method of claim 1, where obtaining the mask function from the non-transitory computer-readable medium includes accessing a lookup table having a plurality of entries, and separately retrieving individual entries to generate the mask function.

12. A method of building an image representation for use in semiconductor processes, applied to an imaging device that includes a radiation source and an optics device, comprising:
   (a) obtaining a set of source points that collectively represent the radiation source, each source point corresponding to a source region;
   (b) obtaining from a non-transitory computer-readable medium a mask function;
   (c) obtaining a projection function that is dependent upon at least one source point of the set;
   (d) combining the mask function with the projection function to obtain a combined result;
   (e) repeating (c-d) so as to encompass each source point of the set; and
   (f) aggregating at least some of the combined results to obtain the image representation;
   where
      the mask function is source-independent, and
      (c) includes performing a convolution of the general form $$k_i(x', y', z', z_0) \otimes m(x', y')$$

where k represents the projection function, i represents the source point, z' represents the position within the imaging medium along a dimension of projection, x' and y' represent image plane coordinates in a plane substantially perpendicular to the dimension of projection, m(x',y') represents the mask function in the image plane coordinate system x', y' and $z_0$ represents focal plane position.

13. The method of claim 1, where combining the mask function with the projection function further includes combining the mask function with the projection function and a third function, selected from the group consisting of a second source-dependent projection function or a development function.

14. A method of building an image representation for use in semiconductor processes, applied to an imaging device that includes a radiation source and an optics device, comprising:
   (a) obtaining a set of source points that collectively represent the radiation source, each source point corresponding to a source region;
   (b) obtaining from a non-transitory computer-readable medium a mask function;
   (c) obtaining a projection function that is dependent upon at least one source point of the set;
   (d) combining the mask function with the projection function to obtain a combined result;
   (e) repeating (c-d) so as to encompass each source point of the set; and
   (f) aggregating at least some of the combined results to obtain the image representation;
   where
      obtaining the projection function includes obtaining a pupil function and computing a shifted effective pupil function,
      the effective pupil is shifted by an amount equal to the coordinates of one of the source points, and
      the shifted effective pupil is obtained according to a computation that is of the general form of $$k_{i,n}(x', y', z', z_0) = FT^{-1}(P_{i,n}(\alpha'-\alpha_i, \beta'-\beta_i, z', z_0))$$

where $FT^1$ represents the inverse Fourier transform, $P_{i,n}$ represents the effective pupil function for the coordinate n of the electrical field inside the resist corresponding to the source point i, $\alpha'$ and $\beta'$ are the coordinates in the pupil plane, $\alpha$ and $\beta$ are the coordinates in the source plane, and $\alpha_i$ and $\beta_i$ are the coordinates the source point i in the source plane.

15. The method of claim 1, where combining the mask function with the projection function further includes combining the mask function with a development function, including at least one function describing etch effects.

16. The method of claim 1, where the projection function includes at least one function selected from the group consisting of: a pupil function; a pupil filtering function; a pupil apodization function; a defocus function; a obliquity function; a function describing the aberration of the projection lens; a function describing the polarization of the illuminator; a Jones pupil corresponding to the birefringence of the mask substrate; a Jones pupil of the pellicle applied on the mask; a Jones pupil of the projection lens; a vector effects function; a thin film effects function; or a mask transmission error function.

17. An apparatus comprising instructions stored on non-transitory machine-readable media, the instructions when executed causing a machine to:
   (a) obtain a set of source points that collectively represent a radiation source, each source point corresponding to a source region;
   (b) retrieve from non-transitory computer-readable storage a mask function;
   (c) obtain a projection function dependent upon at least one source point of the set;
   (d) computationally combine the mask function with the projection function to obtain a combined result, and store the combined result in digital memory;
   (e) repeat (c-d) to encompass each source point of the set; and
   (f) aggregate at least some of the combined results to obtain a simulated image for the semiconductor mask
   where the instructions further cause a machine when executed to perform optics enhancement by
      performing (f) plural times, each time for a different projection function,
      storing each resultant image representation,
      comparing each of the resultant associated image representations with a semiconductor mask design, and
      selecting a protection function based upon the comparing.

18. The apparatus of claim 17, where the instructions further cause a machine when executed to perform mask optimization by comparing the image representation with a semiconductor mask design associated with the mask function to detect error, changing the semiconductor mask design associated with the mask function so as to reduce the error, and storing a modified semiconductor mask design in a digital storage device.

19. The apparatus of claim 17, where the instructions further cause a machine when executed to perform source optimization by performing (f) plural times, each time for a different group of combined results to represent different subsets of one or more source points of the set, comparing resultant associated image representations with a semiconductor mask design, and selecting a subset of one or more of the source points based upon the comparing.

20. The apparatus of claim 19, where the instructions further cause a machine when executed to perform (f) plural times by, for each of the plural times, storing a digital storage of an image representation for the respective different subset of one or more source points.

21. The apparatus of claim 20, where the instructions further cause a machine when executed to:
for each of the plural times, obtain the set by obtaining exactly one source point, and aggregate by outputting and storing an image representation for exactly one source region; and
perform the comparison by comparing multiple image representations associated with plural, different source regions with the semiconductor mask design.

22. The apparatus of claim 17, where the instructions further cause a machine when executed to vary for each different projection function a numerical aperture associated with a lens device.

23. The apparatus of claim 17, where the instructions further cause a machine when executed to load a mask layout file and compute a mask transfer function from the mask layout file, including by:
receiving a polygon from the layout file, the polygon corresponding to a portion of an integrated circuit;
performing a computation of the placement of one of the edges of the polygon using at least said projection function and said mask transfer function to provide a computer readable corrected layout file comprising a modified set of polygons.

24. The apparatus of claim 23, where the instructions further cause a machine when executed to separately store a plurality of corrected layout files, each layout file corresponding to a different portion of the integrated circuit.

25. The apparatus of claim 17, where the instructions further cause a machine when executed to obtain from the non-transitory computer-readable medium a mask function that is source-independent.

26. An apparatus comprising instructions stored on non-transitory machine-readable media, the instructions when executed causing a machine to:
(a) obtain a set of source points that collectively represent a radiation source, each source point corresponding to a source region;
(b) retrieve from non-transitory computer-readable storage a mask function;
(c) obtain a projection function dependent upon at least one source point of the set;
(d) computationally combine the mask function with the projection function to obtain a combined result, and store the combined result in digital memory;
(e) repeat (c-d) to encompass each source point of the set; and
(f) aggregate at least some of the combined results to obtain a simulated image for the semiconductor mask;
where the instructions further cause a machine when executed to perform (c) by performing a convolution of the general form $$k_i(x', y', z', z_0) \otimes m(x', y')$$

where k represents the projection function, i represents the source point, z' represents the position within the imaging medium along a dimension of projection, x' and y' represent image plane coordinates in a plane substantially perpendicular to the dimension of projection, $m(x',y')$ represents the mask function in the image plane coordinate system x', y' and $z_0$ represents focal plane position.

27. The apparatus of claim 17, where the instructions further cause a machine when executed to further combine the mask function and the projection function with a third function, selected from the group consisting of a second source-dependent projection function or a development function.

28. An apparatus comprising instructions stored on non-transitory machine-readable media, the instructions when executed causing a machine to:
(a) obtain a set of source points that collectively represent a radiation source, each source point corresponding to a source region;
(b) retrieve from non-transitory computer-readable storage a mask function;
(c) obtain a projection function dependent upon at least one source point of the set;
(d) computationally combine the mask function with the projection function to obtain a combined result, and store the combined result in digital memory;
(e) repeat (c-d) to encompass each source point of the set; and
(f) aggregate at least some of the combined results to obtain a simulated image for the semiconductor mask;
where the instructions further cause a machine when executed to
compute an effective pupil function that is dependent upon shift corresponding to deviation from coordinates of one of the source points, and
shift the effective pupil according to a computation that is of the general form of $$k_{i,n}(x', y', z', z_0) = FT^{-1}(P_{i,n}(\alpha'-\alpha_i, \beta'-\beta_i, z', z_0))$$

where $FT^{-1}$ represents the inverse Fourier transform, $P_{i,n}$ represents the effective pupil function for the coordinate n of the electrical field inside the resist corresponding to the source point i, $\alpha'$ and $\beta'$ are the coordinates in the pupil plane, $\alpha$ and $\beta$ are the coordinates in the source plane, and $\alpha_i$ and $\beta_i$ are the coordinates the source point i in the source plane.

29. The apparatus of claim 17, where the instructions further cause a machine when executed to combine at least one of the mask function or the projection function with a development function, including at least one function describing etch effects.

30. The apparatus of claim 17, where the instructions further cause a machine when executed to utilize a projection function including at least one function selected from the group consisting of: a pupil function; a pupil filtering function; a pupil apodization function; a defocus function; a obliquity function; a function describing the aberration of the projection lens; a function describing the polarization of the illuminator; a Jones pupil corresponding to the birefringence of the mask substrate; a Jones pupil of the pellicle applied on the mask; a Jones pupil of the projection lens; a vector effects function; a thin film effects function; or a mask transmission error function.

* * * * *